(12) United States Patent
Muemmler et al.

(10) Patent No.: US 7,371,645 B2
(45) Date of Patent: May 13, 2008

(54) METHOD OF MANUFACTURING A FIELD EFFECT TRANSISTOR DEVICE WITH RECESSED CHANNEL AND CORNER GATE DEVICE

(75) Inventors: Klaus Muemmler, Dresden (DE); Peter Baars, Dresden (DE); Stefan Tegen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 132 days.

(21) Appl. No.: 11/321,450

(22) Filed: Dec. 30, 2005

(65) Prior Publication Data

US 2007/0155119 A1 Jul. 5, 2007

(51) Int. Cl.
*H01L 21/336* (2006.01)
*H01L 21/8242* (2006.01)
*H01L 27/108* (2006.01)
*H01L 29/76* (2006.01)
*H01L 29/94* (2006.01)

(52) U.S. Cl. ............... 438/270; 438/241; 438/242; 438/243; 438/244; 438/258; 438/259; 438/260; 438/261; 438/262; 438/263; 438/264; 438/265; 438/266; 438/267; 438/268; 438/269; 438/287; 438/296; 438/297; 438/386; 438/427; 438/428; 257/296; 257/298; 257/300; 257/301; 257/329; 257/330; 257/331; 257/332; 257/333; 257/E27.084; 257/E27.085; 257/E27.09

(58) Field of Classification Search ............... 257/296, 257/298, 300, 301, 329–333, E27.084, E27.085, 257/E27.09; 438/424, 241–244, 258–270, 438/287, 296, 297, 386, 427, 428

See application file for complete search history.

(56) References Cited

U.S. PATENT DOCUMENTS

| | | | | |
|---|---|---|---|---|
| 5,945,707 | A * | 8/1999 | Bronner et al. ............. | 257/330 |
| 6,503,784 | B1 * | 1/2003 | Enders et al. ............... | 438/199 |
| 6,586,794 | B2 * | 7/2003 | Nakamura et al. .......... | 257/296 |
| 6,770,928 | B2 * | 8/2004 | Sommer et al. ............ | 257/301 |
| 2002/0004271 | A1 * | 1/2002 | Weis ........................... | 438/243 |
| 2004/0197965 | A1 * | 10/2004 | Birner et al. ................ | 438/149 |
| 2005/0077563 | A1 * | 4/2005 | Alsmeier ..................... | 257/301 |
| 2005/0127420 | A1 * | 6/2005 | Kito et al. ................... | 257/296 |
| 2005/0151206 | A1 * | 7/2005 | Schwerin .................... | 257/390 |
| 2006/0022239 | A1 * | 2/2006 | Mouli ......................... | 257/296 |
| 2006/0056228 | A1 * | 3/2006 | Schloesser et al. .......... | 365/149 |
| 2006/0076602 | A1 * | 4/2006 | Harter et al. ................ | 257/301 |
| 2006/0110884 | A1 * | 5/2006 | Wang et al. ................. | 438/270 |

(Continued)

*Primary Examiner*—Steven Loke
*Assistant Examiner*—Arman Khosraviani
(74) *Attorney, Agent, or Firm*—Edell, Shapiro & Finnan, LLC

(57) ABSTRACT

Fabrication of recessed channel array transistors (RCAT) with a corner gate device includes forming pockets between a semiconductor fin that includes a gate groove and neighboring shallow trench isolations that extend along longs sides of the semiconductor fin. A protection liner covers the semiconductor fin and the trench isolations in a bottom portion of the gate groove and the pockets. An insulator collar is formed in the exposed upper sections of the gate groove and the pockets, wherein a lower edge of the insulator collar corresponds to a lower edge of source/drain regions formed within the semiconductor fin. The protection liner is removed. The bottom portion of the gate groove and the pockets are covered with a gate dielectric and a buried gate conductor layer. The protection liner avoids residuals of polycrystalline silicon between the active area in the semiconductor fin and the insulator collar.

13 Claims, 24 Drawing Sheets

U.S. PATENT DOCUMENTS

2006/0244024 A1* 11/2006 Manger et al. ............. 257/296
2007/0037345 A1* 2/2007 Manger ..................... 438/239
2007/0057301 A1* 3/2007 Wang et al. ................ 257/296

* cited by examiner

FIG 10A
FIG 10B
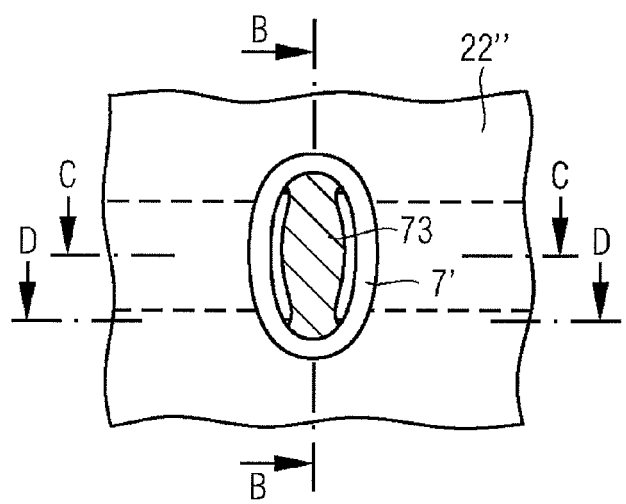
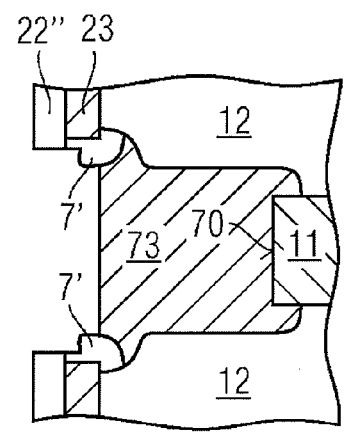
FIG 10C
FIG 10D
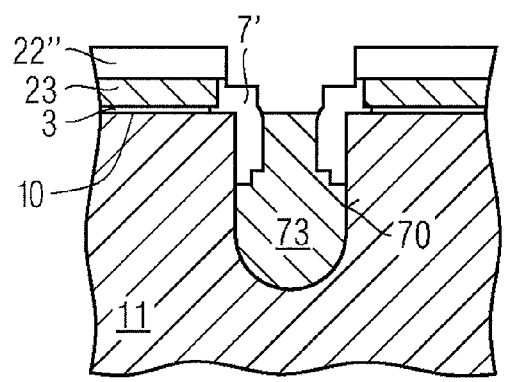
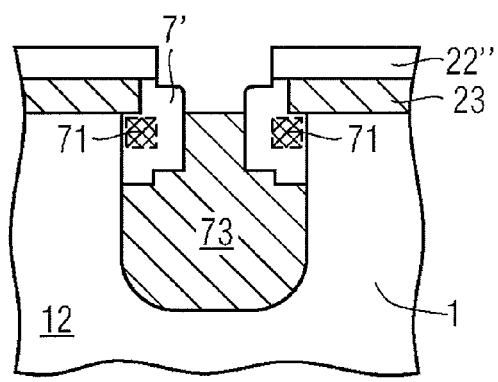

FIG 17A
FIG 17B
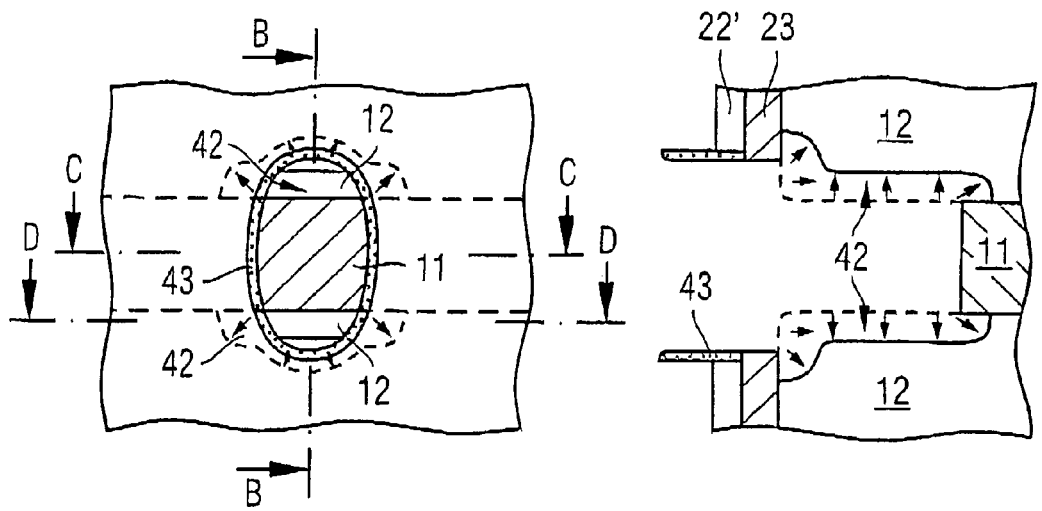
FIG 17C
FIG 17D
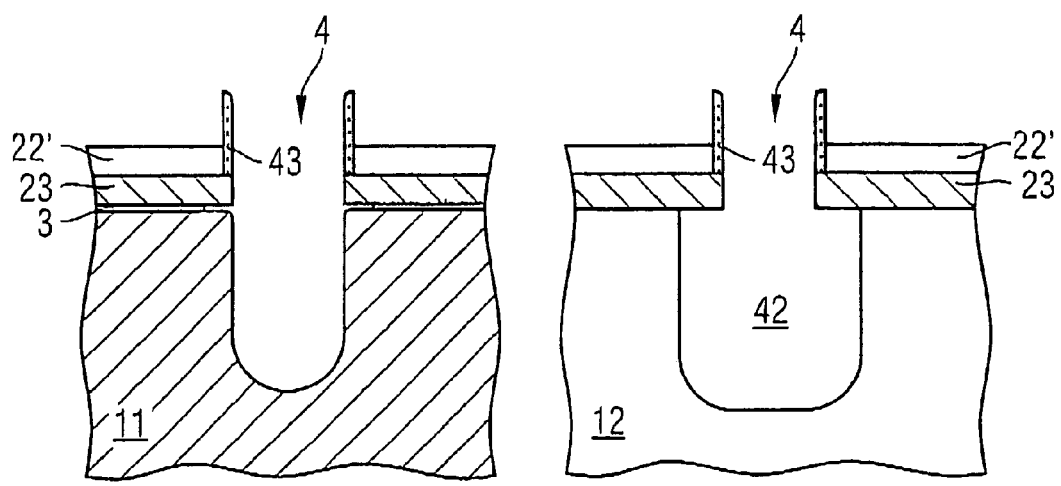

METHOD OF MANUFACTURING A FIELD EFFECT TRANSISTOR DEVICE WITH RECESSED CHANNEL AND CORNER GATE DEVICE

TECHNICAL FIELD

The present invention relates generally to a method of manufacturing a field effect transistor device having a recessed channel and corner gate devices.

BACKGROUND OF INVENTION

A semiconductor memory cell typically includes a storage device for storing data and an access device for accessing the data stored in the storage device.

In DRAM memory cells, data is stored by charging or discharging a storage capacitor. In stacked capacitor type memory cells, the capacitors are placed above the access devices. In trench capacitor type memory cells, the storage devices are buried in the substrate in which the access transistors are formed.

Typically the access devices are field-effect transistors (FETs). Active areas of the access transistors are formed in a single crystalline semiconductor substrate such as a silicon wafer. The active areas comprise a first doped region defining a first source/drain region, a second doped region defining a second source/drain region and a channel region between the first and the second source/drain-region. The first and the second doped region are of a first conductivity type. The channel region is not doped or is of a second conductivity type that is the opposite of the first conductivity type.

The first doped region forms a bit line contact section and is coupled to a bit line. The bit line transmits data to and from the memory cell. The second doped region forms a storage node contact section and is connected to a storage node electrode of the capacitor.

The access transistor is controlled by a voltage applied to a gate electrode, which for planar transistor devices is arranged above a pattern surface of the substrate and which is adjacent to the respective channel section. A gate dielectric insulates the gate electrode from the channel region. The electric potential of the gate electrode controls the charge carrier distribution by capacitive coupling in the adjoining channel section. The gate electrodes of the access transistors of a plurality of memory cells are connected and form a connectivity line (word line) for addressing a group of memory cells within a memory cell array.

When a voltage higher than a threshold voltage is applied to the gate electrode, an enhancement zone of mobile charge carriers is induced in the channel section, wherein the charge carriers form a conductive channel in the channel section between the storage node contact section and the bit line contact section. The conductive channel connects the storage node electrode of the capacitor to the bit line. When a voltage lower than the threshold voltage is applied to the gate electrode, the storage node electrode of the capacitor remains insulated from the bit line.

Planar field effect transistors do not scale down well to sub 100 nanometer technologies, which use a feature size of photolithographic patterns of less than 100 nanometers. A maximum packaging density requires a maximum channel length, which corresponds to the minimum feature size. At channel lengths below 100 nanometers, short channel effects occur, for example sub-threshold leakage current.

In U.S. Pat. No. 5,945,707, the disclosure of which is incorporated herein by reference, a recessed channel array transistor (RCAT) with enhanced effective channel length is described. The first and second source/drain regions are arranged in a horizontal plane parallel to the pattern surface of the semiconductor substrate. Between the first and the second source/drain region a gate groove is etched into the semiconductor substrate. A gate electrode is disposed within the groove. A gate dielectric extends along the semiconductor sidewalls of the gate groove and separates the gate electrode from the channel region. In a conducting state of the RCAT, the channel extends in a first vertical section from the first doped region downwards along the first sidewall of the gate groove, crosses beneath the gate groove in horizontal direction and extends then in a second vertical section along a second sidewall of the gate groove upwards to the second doped region. The effective channel length of a RCAT is a function of the depth of the gate groove and the planar distance between both source/drain regions.

A sphere-shaped RCAT (S-RCAT) with enhanced effective channel length is described in "High-Density Low-Power-Operating DRAM Device Adopting $6F^2$ Cell Scheme with Novel S-RCAT Structure on 80 nm Feature Size and Beyond"; by H. J. Oh et al.; IEEE Proceedings of ESS-DERC; Grenoble, France; 2005. The gate groove is expanded in the bottom section. The effective channel length of the S-RCAT is enhanced, whereas the planar dimensions remain unmodified, such that the S-RCAT enables further enhanced packaging densities.

At maximum packaging density, the effective channel width of a RCAT is equal to the minimum lithographic feature size. The effective channel width corresponds to the resistance of the transistors in the conducting state ($R_{on}$) and affects the switching characteristics of the memory cell.

A RCAT with corner gate device is therefore proposed in German Patent No. DE 103 61 695 B3, the disclosure of which is incorporated herein by reference. Corner sections of a gate electrode partly wrap around a semiconductor fin, which comprises the active area. The corner sections of the gate electrode extend along sections of vertical sidewalls of the semiconductor fin. In the conducting state of the RCAT, the channel is formed both along the sidewalls of the gate groove and along the sidewalls on the long sides of the semiconductor fin. The channel width is increased by the portion of the channel that extends along the sidewalls of the semiconductor fin. Due to the increased channel width, RCATs with FinFET-like corner gate devices, also known as extended U-groove transistors (EUT), show a lower On-Resistance $R_{on}$ and faster switching properties.

A method of manufacturing a RCAT with corner gate device is described in German Patent No. DE 103 61 695 B3. According to that method, a stripe-shaped semiconductor fin with a first and a second vertical sidewall on the long sides of the fin is formed in a single crystalline silicon substrate. Shallow trench isolations made of silicon oxide are formed on both long sides of the fin. The short sides of the fin define a first and a second end of the fin. Between the first and the second end of the fin, a gate groove is etched into the semiconductor fin, which extends from one long side of the fin to the other. An isotropic oxide etch process is performed. The etching pulls back the shallow trench isolations from the long sides of the semiconductor fin, wherein the pullback starts from the intersecting plane between the gate groove and the shallow trench isolations. The recess leaves pockets in the shallow trench isolation, which are adjacent to the gate groove. A gate oxide is grown on the semiconductor fin. The gate groove and the pockets are filled with a gate conductor material. In the upper section of the fin, the first source/drain region is formed at the first end of the fin, and the second source/drain region is formed at the second end of the fin by implanting ions.

Capacitive coupling between the gate electrode and the source/drain regions deteriorates the switching characteristics of the transistor.

A method for fabricating an insulator collar between the source/drain regions and the gate electrode of a RCAT with corner gate device is described in U.S. patent application Ser. No. 11/222,613, the disclosure of which is incorporated herein by reference.

A first gate conductor material is recessed after deposition such that the first gate conductor material fills only a bottom portion of the gate groove and the pockets respectively. An insulator collar is provided on the exposed portions of the semiconductor fin above the recessed first gate conductor material. The thickness of the insulator collar is greater than the thickness of the gate oxide. Then, a second gate conductor material is deposited on top of the recessed first gate conductor material. When polycrystalline silicon (polysilicon) is used as the first and the second gate conductor material, a polysilicon-polysilicon interface within the gate groove results from this method, wherein the polysilicon-polysilicon interface disadvantageously deteriorates the electrical resistance of the gate electrode structure.

Experimental results for RCATs fabricated according to the described method show inferior switching characteristics and a wider range for the switching characteristics among a plurality of devices that emerge from the same substrate than expected. Therefore a need exists for a method of fabricating a recessed channel array transistor with corner gate device which provides enhanced switching characteristics and which reduces a deviation of the switching characteristics among the members of a plurality of RCATs formed on the same substrate.

SUMMARY

In a first aspect, the present invention includes a method of manufacturing a field effect transistor device with a recessed channel and corner gate device. A semiconductor fin with two opposing long sides and two opposing short sides within a semiconductor substrate is formed. Shallow trench isolations are provided at both long sides of the semiconductor fin. A gate groove is provided in the semiconductor fin between the short sides, wherein the gate groove extends between the long sides of the semiconductor fin. The shallow trench isolations are recessed isotropically, wherein the recess starts from interface planes of the gate groove and the shallow trench isolations. Pockets are thereby formed between the semiconductor fin and the shallow trench isolations. The pockets extend along the long sides of the semiconductor fin. A protection liner is provided, which covers the semiconductor fin and the shallow trench isolations in a bottom portion of the gate groove and the pockets. An insulator collar is provided on exposed upper portions of the semiconductor fin. The protection liner is removed, and a gate dielectric is provided that covers the semiconductor fin in the bottom portion of the gate groove and the pockets. The gate groove and the pockets are filled with a buried gate conductor layer, wherein corner gate sections of a gate electrode are formed in the pockets.

Preferably, the gate conductor material is polycrystalline silicon (polysilicon). Polysilicon is not reliably removed from vertical surfaces by dry etching when the vertical surfaces are not directly accessible from above. In the prior art, polysilicon residues may therefore remain on the gate oxide in upper sections of the sidewalls of the semiconductor fin. The polysilicon residues or "poly stringers" extend between the gate oxide and the insulator collar along the upper section of the gate groove and the pockets adjacent to the source/drain regions in the semiconductor fin. The poly stringers are electrically connected to the gate electrode and increase the drain-to-gate capacity $C_{DG}$ and the source-to-gate capacity $C_{SG}$.

By providing a temporary protection liner in lieu of the recessed gate material as a mask for the formation of the insulator collar, the formation of polysilicon residues in the upper section of the grooves and the pockets is suppressed, because no silicon is temporarily provided on a permanent structure in the upper section. During removal of the protection liner, polysilicon residues, which may result from the recess of the sacrificial fill, are reliably removed.

Since the gate groove and the pockets may be filled in one single step, one polysilicon-polysilicon interface within the gate electrode is advantageously avoided, in contrast to the prior art.

Forming the protection liner comprises the deposition of a conformal protection liner. Then, a sacrificial material is deposited and recessed, such that a residual portion of the sacrificial material forms a sacrificial fill. The sacrificial fill covers the conformal protection liner in the bottom portions of the gate groove and the pockets. In upper portions of the gate groove and the pockets, the protection liner is exposed. The exposed sections of the conformal protection liner are removed. The residual portion of the conformal protection liner forms the protection liner that lines exclusively the bottom sections of the pockets and the gate groove. By use of the sacrificial fill, the upper edge of the protection liner is well controlled.

According to one preferred embodiment, the insulator collar is formed by thermal oxidation of the semiconductor material. The sacrificial fill may then be removed before the formation of the collar. In this case, the sacrificial material is preferably polysilicon, amorphous carbon or a polymer.

According to another preferred embodiment, the insulator collar is formed by deposition, with the sacrificial fill still filling the bottom portions of the gate groove and the pockets. In this case, the sacrificial material is preferably polysilicon.

Preferably, the conformal protection liner is deposited such that the pockets between the semiconductor fin and the shallow trench isolations are filled completely.

According to a preferred embodiment of the invention, the gate groove is formed by deposition of a mask stack on the semiconductor substrate. The mask stack covers the shallow trench isolations and the semiconductor fin. An opening is formed in the mask stack. The opening is placed symmetrically above the semiconductor fin and between the short sides of the semiconductor fin. The opening extends at least between the long sides of the semiconductor fin. The semiconductor fin is etched selectively to the shallow trench isolations.

Depositing the mask stack comprises preferably the deposition of a bottom polysilicon mask layer, the deposition of an oxide mask layer and the deposition of a top polysilicon mask layer.

According to a further embodiment of the invention, to provide the opening in the mask stack, a resist layer is patterned by photolithography, wherein the resist layer has a resist opening corresponding to the opening in the mask stack. The resist opening is transferred into the top polysilicon mask layer and into the oxide mask layer.

A nitride spacer is formed on the inner sidewall of the opening in the top polysilicon mask layer and the oxide mask layer. Then, the opening is transferred into the bottom polysilicon mask layer.

According to yet another embodiment of the invention, to provide the opening in the mask stack, a resist layer is patterned by photolithography, wherein the resist layer has a resist opening that corresponds to the opening in the whole mask stack. The resist opening is transferred into the mask stack, and a nitride spacer is formed on the inner sidewall of the opening of the mask stack.

When a conventional three-layer mask stack comprising a bottom polysilicon mask layer, an oxide mask layer, and a top polysilicon mask layer is used for the formation of the gate groove and the pockets, then, during the formation of the pockets, the oxide mask layer may be pulled back from the opening that defines the gate groove etch. The pullback of the oxide mask layer may expose the bottom polysilicon mask layer. Further, during removal of the sacrificial fill, the bottom polysilicon mask layer is removed in the exposed sections wherein a sacrificial oxide is exposed, which covers the semiconductor fin. The exposed sections of the sacrificial oxide may be removed during the spacer etch in course of the formation of the insulator collar. As a consequence, when a gate conductor material is deposited on the exposed surface of the semiconductor fin, a short-circuit may occur between the gate electrode and the source/drain regions, which are formed within the semiconductor fin.

By providing the nitride spacer on the inner sidewalls of the opening in the mask stack, a pull back of the oxide mask layer is suppressed, such that in the following a short-circuit between the gate electrode and a source/drain region of the transistor is advantageously avoided.

Within the semiconductor fin, a first and a second source/drain region are provided, wherein the first source/drain region is formed within a first section of the semiconductor fin that adjoins a first short side, and wherein the second source/drain region is formed within a second section of the semiconductor fin that adjoins a second short side opposing the first short side. Both the first and the second source/drain region are formed in upper portions of the semiconductor fin and adjacent to the insulator collar. The lower edge of the source/drain regions corresponds essentially to the lower edge of the insulator collar.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF DRAWINGS

The disclosure will present in detail the following description of referred embodiments with reference to the following Figures.

FIGS. 1A to 11D illustrate a first embodiment of the inventive method via plan views and corresponding cross-sectional views of a semiconductor substrate being processed in accordance with the first embodiment of the present invention providing a thermal grown insulator collar and a three-layer mask spacer.

FIGS. 15A to 23D illustrate a third embodiment of the inventive method via plan views and corresponding cross-sectional views of a semiconductor substrate being processed in accordance with the third embodiment of the present invention providing a deposited insulator collar and a two-layer mask spacer.

Corresponding numerals in the different figures refer to corresponding parts and structures unless otherwise indicated. The figures are drawn to clearly illustrate the relevant aspects of the preferred embodiments and are not necessarily in all respects drawn to scale.

DETAILED DESCRIPTION

Figure 1A:
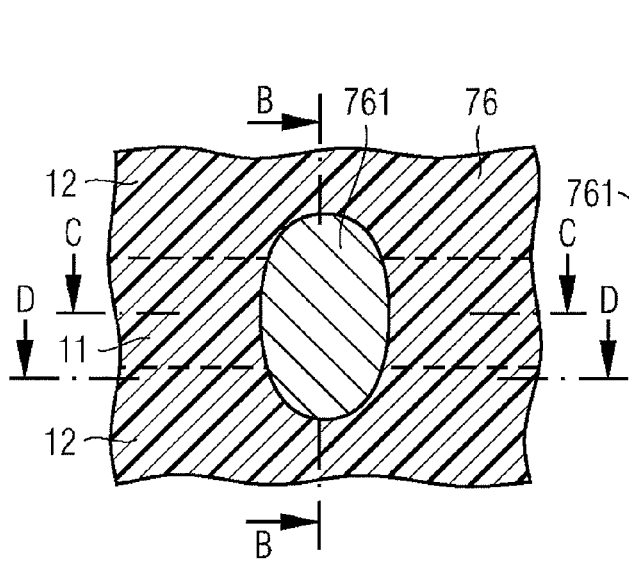

Referring to FIGS. 1A through 11D, a process of fabricating a recess channel array transistor with corner gate device according to an exemplary embodiment of the invention is shown via plan views and corresponding cross-sectional views, respectively. A semiconductor substrate 1 is provided, which is preferably made of a semiconductor material such as single crystalline silicon. In the semiconductor substrate 1, parallel isolation trenches are formed by photolithographic techniques, wherein a stripe-shaped semiconductor fin 11 with two parallel long sides is formed between the isolation trenches. The isolation trenches are filled with a dielectric material, preferably silicon oxide, such that shallow trench isolations (STI) 12 are formed in the isolation trenches. The shallow trench isolations 12 extend on both long sides of the semiconductor fin 11. A sacrificial oxide 3 covers an upper pattern surface 10 of semiconductor fin 11. The sacrificial oxide 3 may result from a gate oxide formation for support devices in another section of the substrate 1 (not shown).

On the exposed substrate surface, which is in sections formed by the exposed surface of the semiconductor fin 11 and the exposed surface of the shallow trench isolations 12 a mask stack 2 is deposited. The mask stack 2 comprises a bottom polysilicon mask layer 23, an oxide mask layer 22 and a top polysilicon mask layer 21.

Figure 1B:
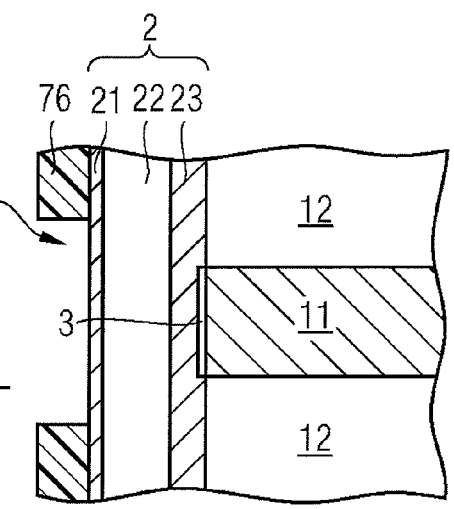
Figure 1C:
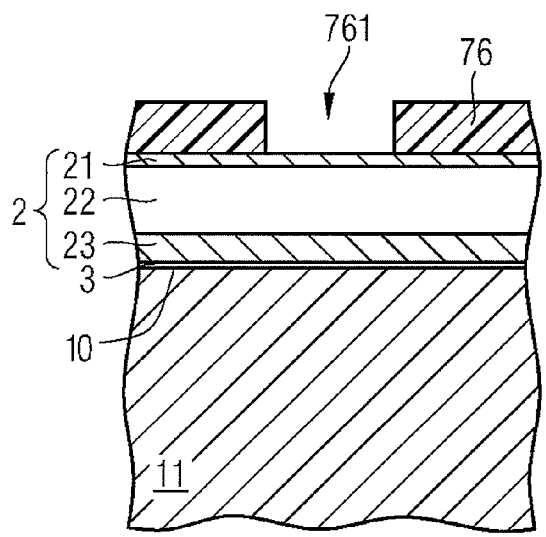
Figure 1D:
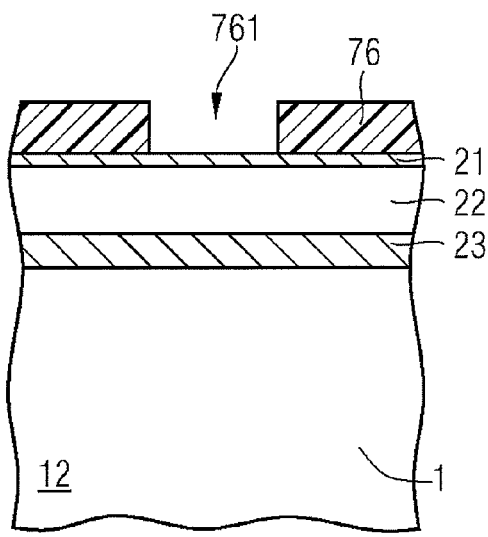

FIGS. 1C and 1D show parallel cross-sectional views of the semiconductor substrate 1 along the semiconductor fin 11 and the shallow trench isolation 12 respectively. FIG. 1B shows a cross-sectional view, which is orthogonal to the cut lines of FIGS. 1C and 1D. The mask stack 2 comprises the bottom polysilicon mask layer 23, the oxide mask layer 22, and the top polysilicon mask layer 21 and covers the semiconductor fin 11 and the shallow trench isolations 12.

A resist layer 76 covers the mask stack 2. A resist opening 761 in the resist layer 76 is formed by a conventional photolithographic process above the semiconductor fin 11 and adjoining sections of the shallow trench isolations 12.

Referring to FIGS. 2A-2D, an anisotropic etching process transfers the pattern of the resist layer 76 with the resist opening 761 into the mask stack 2, such that an opening 4 is formed in the mask stack 2. The pattern of the resist layer 76 is transferred in the mask stack 2 by etching the top polysilicon mask layer 21, the oxide mask layer 22, the bottom polysilicon mask layer 23, and the sacrificial oxide 3 on top of the semiconductor fin 11. The resist layer 76 is removed during or after patterning of the mask stack 2.

The opening 4 is placed symmetrically to the middle of the semiconductor fin 11. The opening 4 exposes a central section of the semiconductor fin 11 and adjacent portions of the adjoining shallow trench isolations 12. A conformal nitride spacer liner is deposited and recessed by an anisotropic etch process. A nitride spacer 40 on the inner sidewall of the opening 4 emerges from the conformal nitride spacer liner.

Figure 2A:
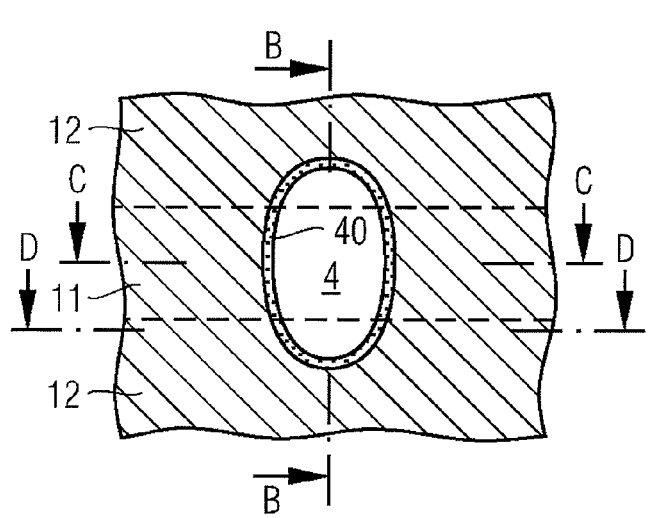
Figure 2B:
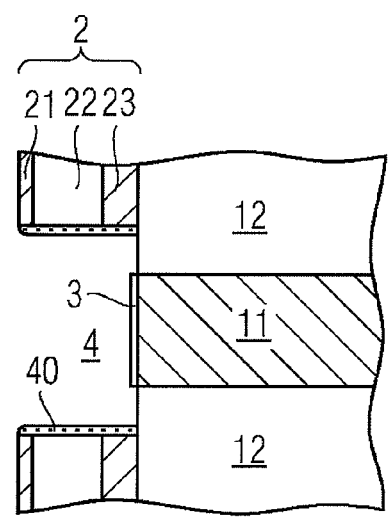
Figure 2C:
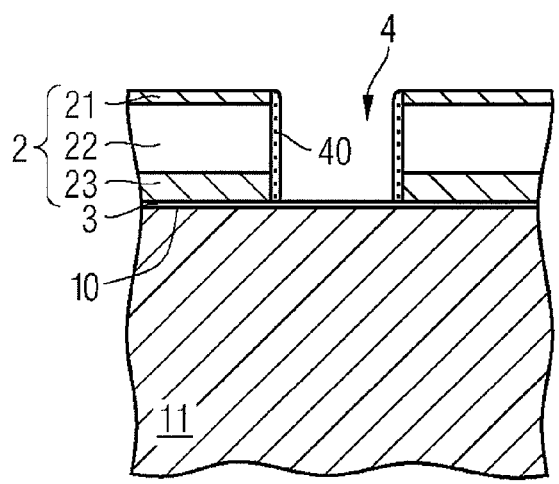
Figure 2D:
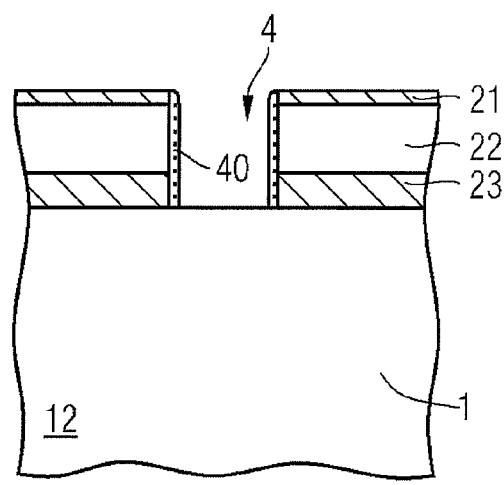

FIG. 2A shows a plan view with the opening 4 in the mask stack 2. The opening 4 extends from one long side of the semiconductor fin 11 to the other and reaches over adjoining sections of the two neighboring shallow trench isolations 12.

As shown in FIGS. 3A-3D, the semiconductor material of the semiconductor fin 11 is etched selectively to the material of the shallow trench isolations 12, wherein a gate groove 41 is formed within the semiconductor fin 11. The etch process is controlled such that the bottom portion of the gate groove 41 is curved or U-shaped.

Figure 3A:
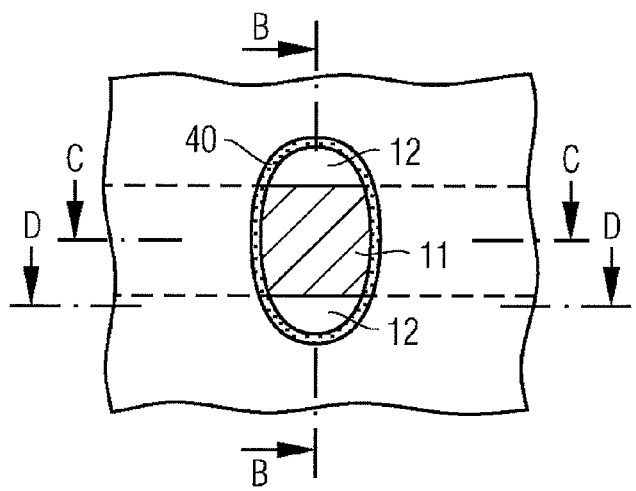
Figure 3B:
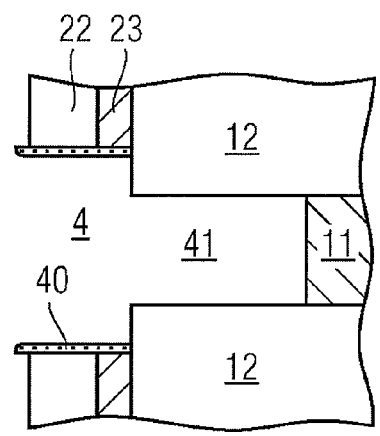
Figure 3C:
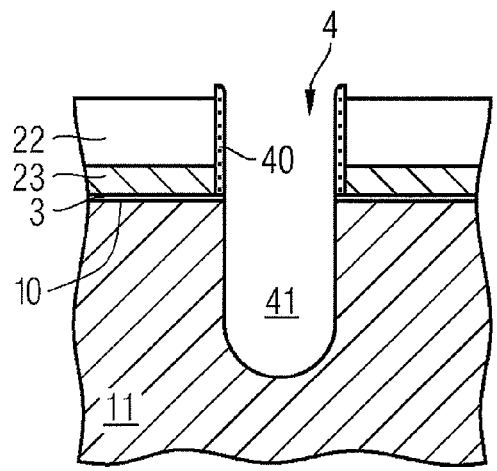
Figure 3D:
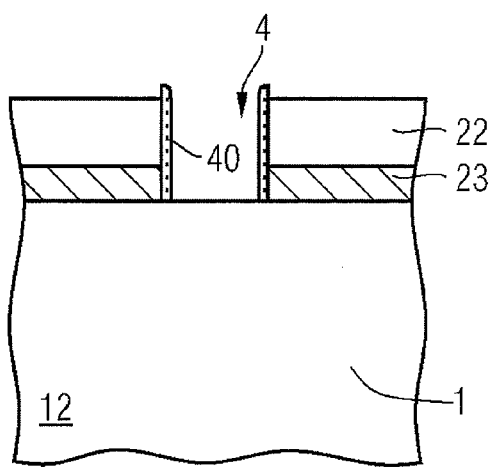

The cross-sectional view according to FIG. 3B shows the semiconductor fin 11, which is recessed below the opening 4. FIGS. 3B and 3D illustrate that the shallow trench isolations 12 remain unmodified in the course of the silicon etch process, whereas the top polysilicon mask layer 21 is removed.

Referring to FIGS. 4A-4D, an isotropic etch process, preferably a wet etch process, is performed that affects the material of the shallow trench isolations 12. In the course of the isotropic etch process, the shallow trench isolations 12 are pulled back from both sides of the gate groove 41. Preferably, the shallow trench isolation material is silicon oxide. In this case, the oxide mask layer 22 is partly recessed in the course of the wet etch process.

Figure 4A:
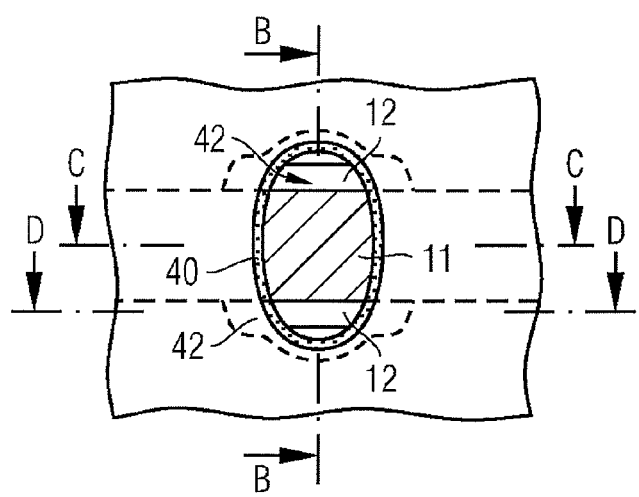
Figure 4B:
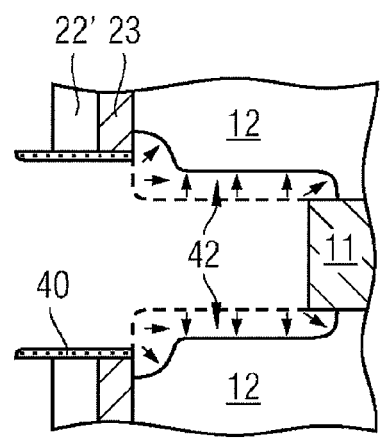

The direction in which the isotropic etch proceeds is illustrated in FIG. 4B. The shallow trench isolations 12 on both long sides of the semiconductor fin 11 are pulled back from the gate groove 41, wherein pockets 42 are formed between the semiconductor fin 11 and the shallow trench isolations 12. The pockets 42 define the area in which the corner sections of the corner gate device are formed in the further course of the process.

Figure 4C:
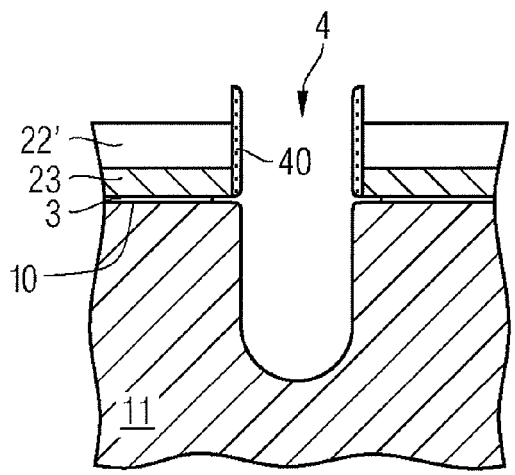
Figure 4D:
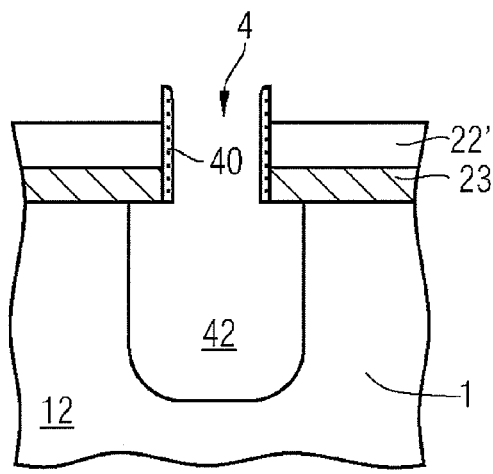

According to FIG. 4C, the recessed oxide mask layer 22' still covers the bottom polysilicon layer 23 after the isotropic etch process. The sacrificial oxide 3 is pulled back from the edges of the gate groove 41. FIG. 4D shows a cross-sectional view along the cut line D of FIG. 4A, which runs along the pocket 42 on the first long side of the semiconductor fin 11. FIG. 4B shows both pockets 42, which wrap around the recessed semiconductor fin 11 at the bottom of gate groove 41.

The plan view of FIG. 4A shows two pockets 42 on both long sides of the semiconductor fin 11 below the opening 4. The dotted line shows the shape of the pockets 42 beneath the mask stack 2.

As shown in FIGS. 5A-5D, a conformal protection liner 5 is deposited, which covers the structure shown in FIGS. 4A-4D. The thickness of the conformal protection liner is about a few nanometers. Preferably the thickness of the conformal protection liner 5 is selected such that at least the sections of the pockets 42 adjacent to the semiconductor fin 11 are filled completely. In the following figures, the thickness of the conformal protection liner 5 is selected to be about a half of the shallow trench isolation pullback distance.

Figure 5A:
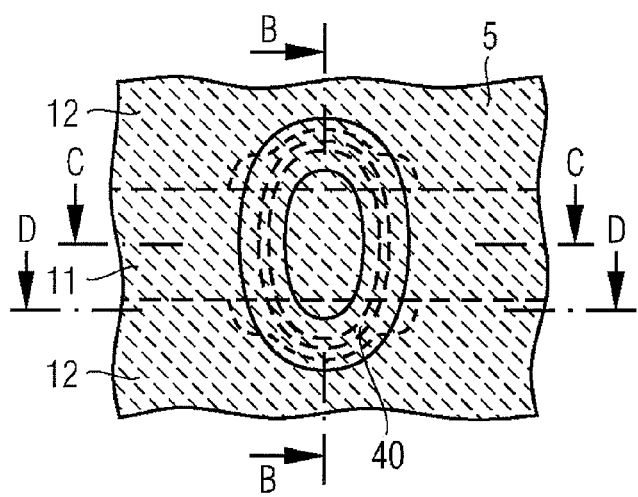

According to FIG. 5A, the conformal protection liner 5 fills completely the sections of the pockets 42, which wrap around the semiconductor fin 11 and which shapes are marked by the dotted lines.

Figure 5B:
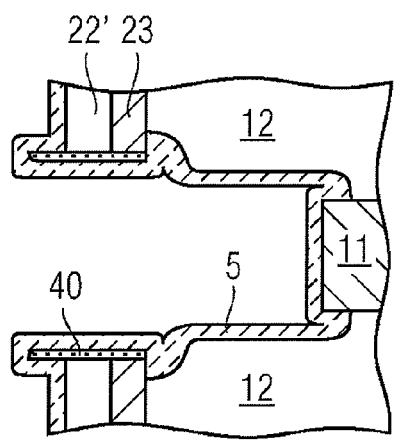
Figure 5C:
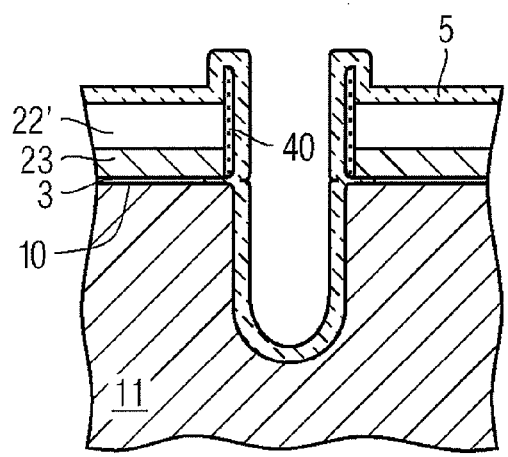
Figure 5D:
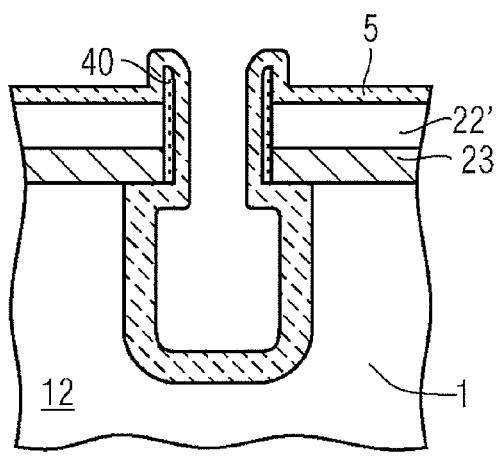
Figure 6A:
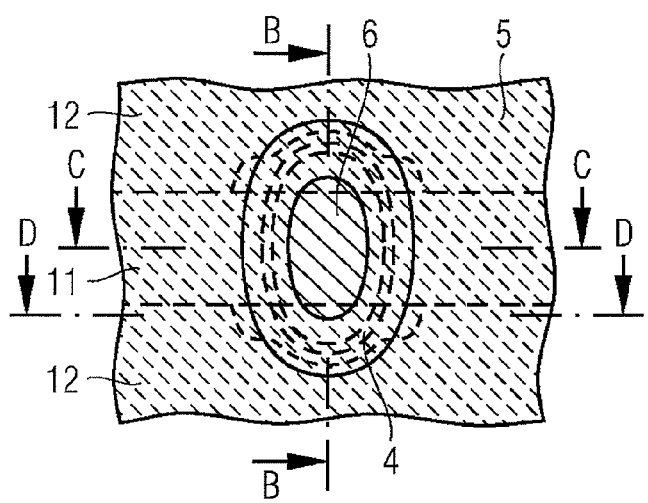
Figure 6B:
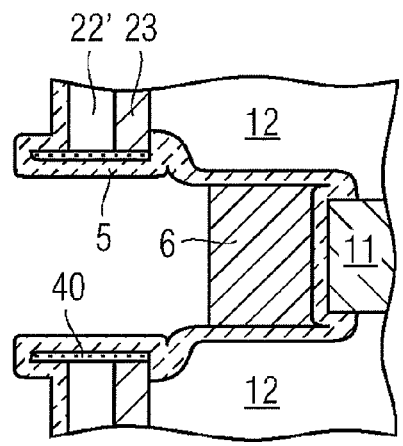
Figure 6C:
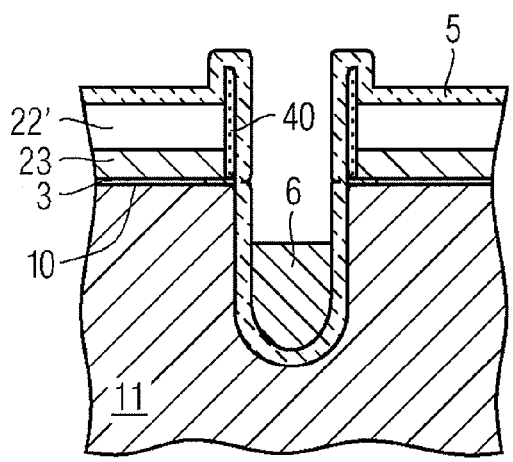
Figure 6D:
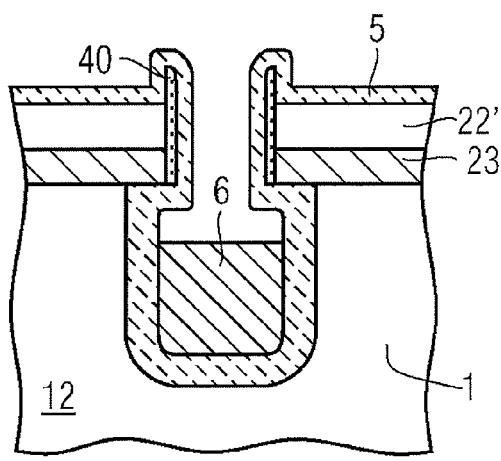

The cross-sectional views of FIGS. 5B, 5C, and 5D illustrate the conformal protection liner 5, which outside the opening 4 covers the recessed oxide mask layer 22', the nitride spacer 40, the semiconductor sidewalls of the gate groove 41, and the inner sidewalls of the pockets 42. The material of the conformal protection liner is preferably silicon nitride.

Referring next to FIGS. 6A-6D, a sacrificial material is deposited and etched back. The recessed sacrificial material forms a sacrificial fill 6 in the bottom portion of the gate groove 41. According to FIG. 6C, the upper edge of the sacrificial fill 6 corresponds to a lower edge of those portions of the semiconductor fin 11 in which the source/drain regions are formed in the further course of the process. According to FIG. 6D, the recessed sacrificial material 6 fills also those sections in the bottom portion of the pockets 42, which are not yet filled by the conformal protection liner 5.

Figure 7A:
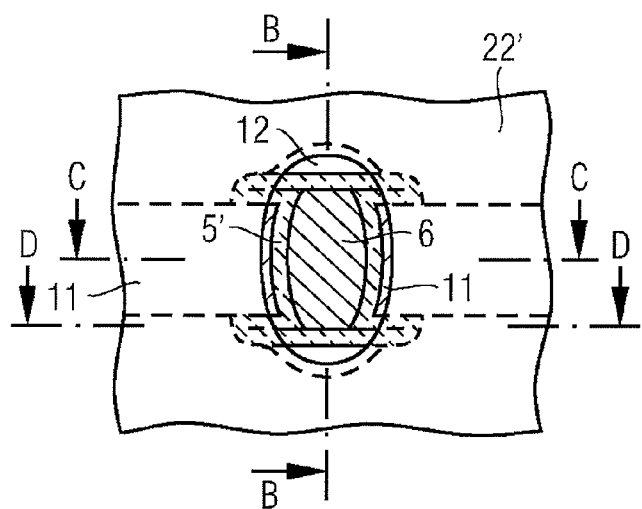
Figure 7B:
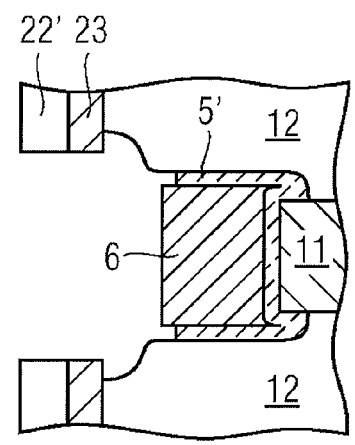
Figure 7C:
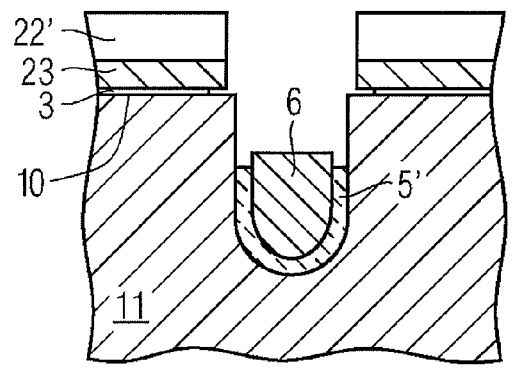
Figure 7D:
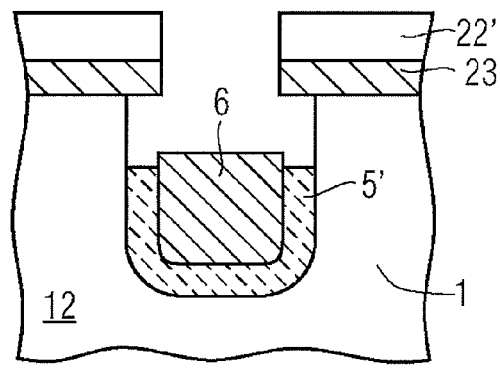

As shown in FIGS. 7A-7D, an etch process is performed, which removes the nitride spacer 40 and upper portions of the conformal protection liner 5. The sacrificial fill 6 masks the bottom portion of the conformal protection liner during the etching process. FIGS. 7B, 7C, and 7D show the remaining protection liner 5' in the bottom portion of the gate groove 41 and the pockets 42. FIG. 7A illustrates the recessed protection liner 5', which surrounds the sacrificial fill 6 in the bottom portion of the gate groove 41. Outside the region surrounded by the protection liner 5', the opening 4 exposes a portion of the shallow trench isolations 12 respectively. Stripes of the semiconductor fin 11 are excavated on both sides of the opening 4. The thickness of the exposed stripes corresponds to the thickness of the removed nitride spacer 40. The recessed oxide mask layer 22' covers the substrate outside the opening 4.

The sacrificial material may be any material that is removable selectively to the material of the conformal protection liner 5 and to the material of the insulator collar 7', which will be formed in further course of the process. Preferably, the sacrificial material is polycrystalline silicon.

Referring now to FIGS. 8A-8D, silicon oxide is grown on exposed portions of silicon, i.e., on the edges of the bottom polysilicon mask layer 23, along lower portions of the inner sidewalls of the opening 4, on the exposed surface of the sacrificial fill 6, and on the exposed portions of the vertical sidewalls of the semiconductor fin 11. A spacer etching affecting the grown silicon oxide may be performed, during which the silicon oxide that is grown on the sacrificial fill 6 is removed.

Figure 8A:
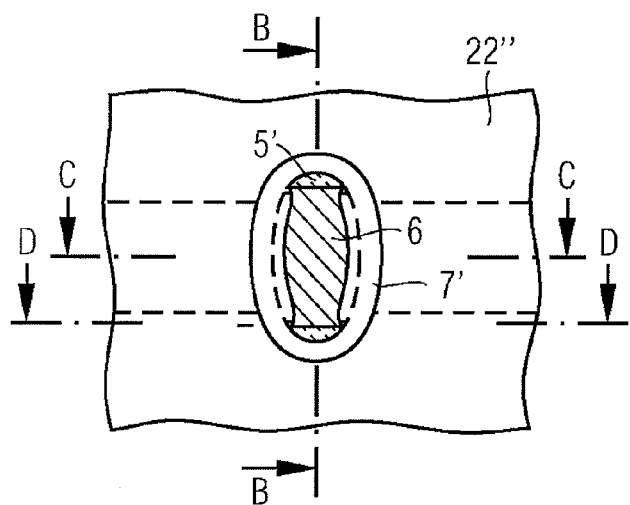
Figure 8B:
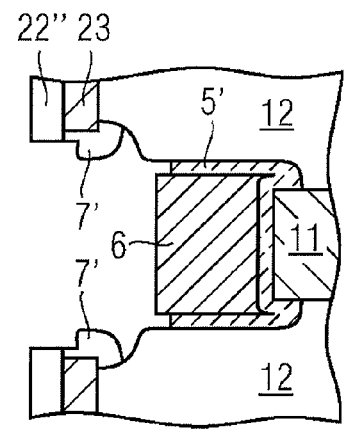
Figure 8C:
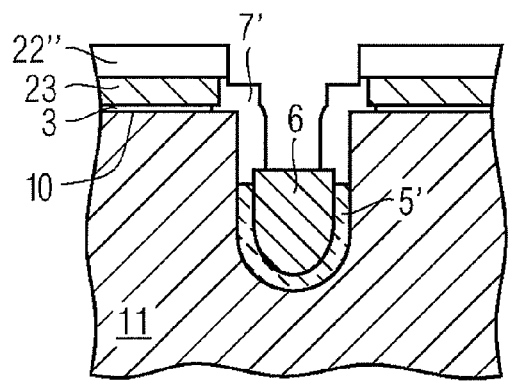
Figure 8D:
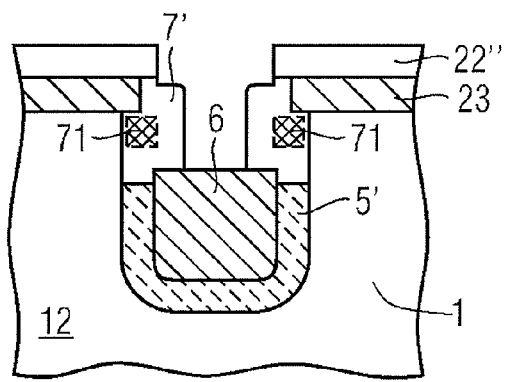
Figure 9A:
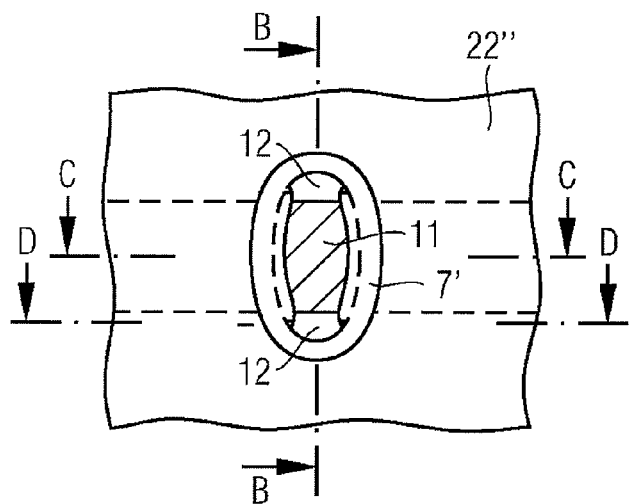
Figure 9B:
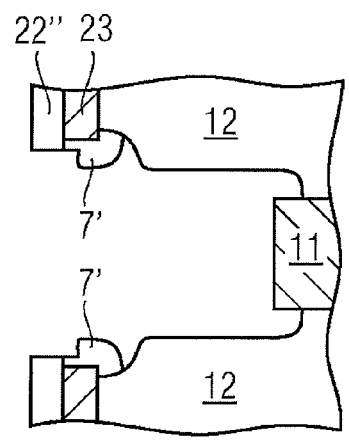
Figure 9C:
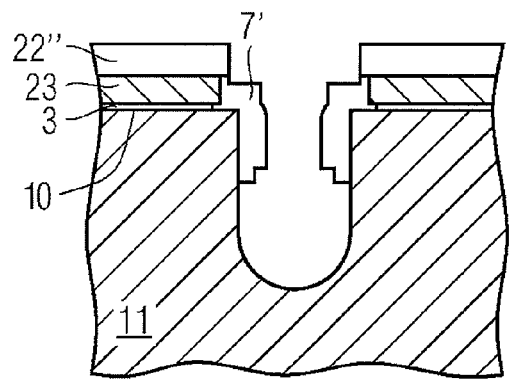
Figure 9D:
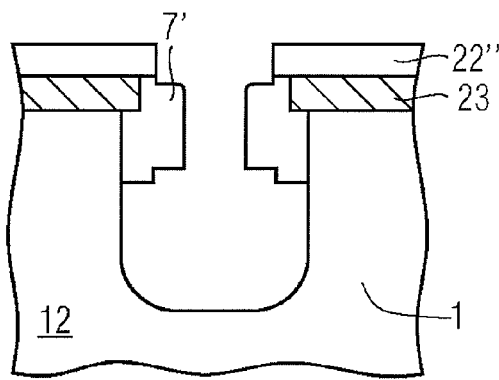
Figure 11A:
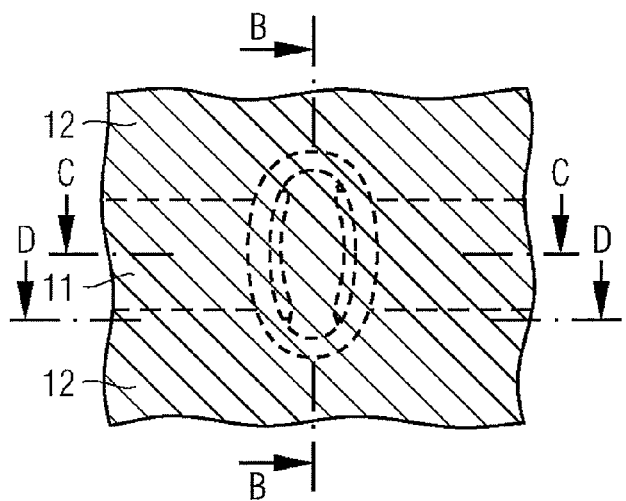
Figure 11B:
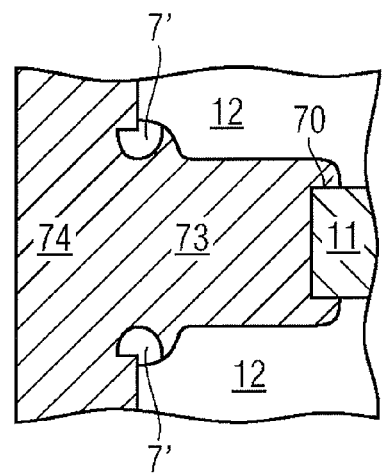
Figure 11C:
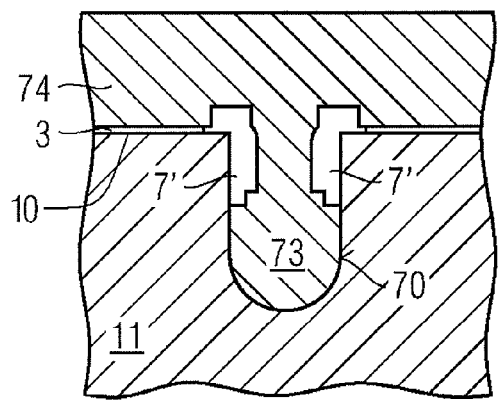
Figure 11D:
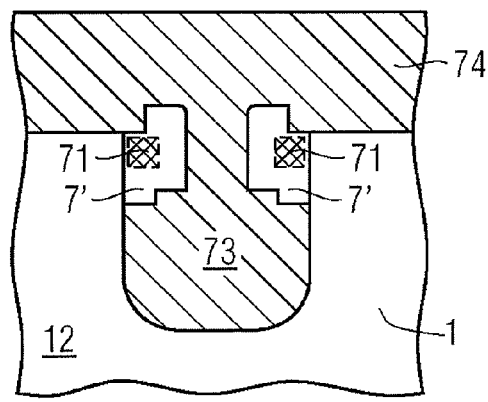
Figure 12A:
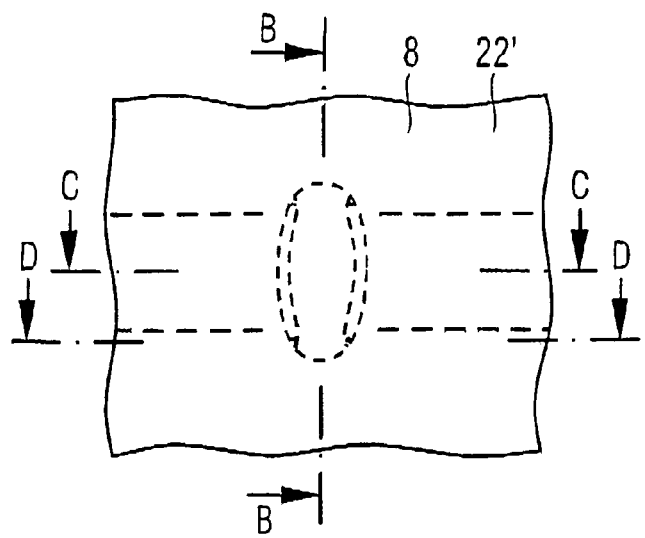
FIGS. 12A to 14D illustrate a second embodiment of the inventive method via plan views and corresponding cross-sectional views of a semiconductor substrate being processed in accordance with the second embodiment of the present invention providing a deposited insulator collar and a three-layer mask spacer.
Figure 12B:
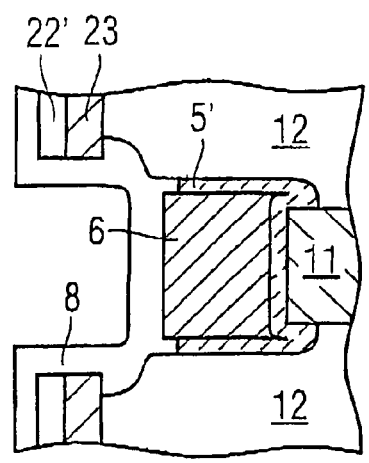
Figure 12C:
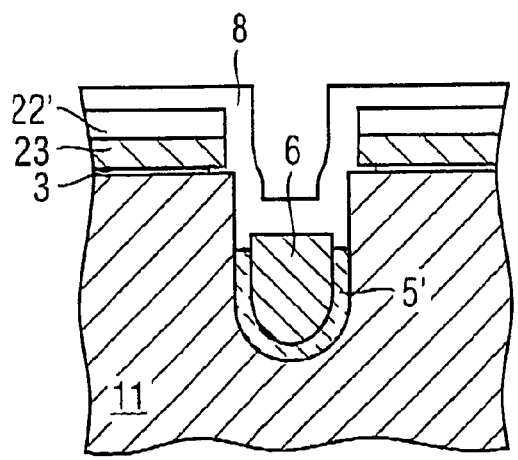
Figure 12D:
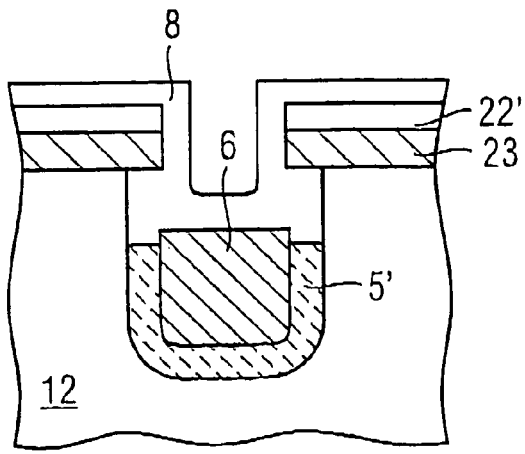

The remaining oxide spacer forms an insulator collar 7', which portions emerge from different silicon sources. A ring portion of the insulator collar 7' along the inner sidewall of the opening 4 predominantly emerges from the oxide growth on the bottom polysilicon mask layer 23. The ring portion is illustrated in FIGS. 8A and 8B. A middle portion 71 of the insulator collar 7' is grown on the semiconductor fin 11. FIG. 8D shows the middle portion 71, which extends into the gate groove 41 and into the pockets 42. The remaining opening defined by the insulator collar 7' within the gate groove 41 is smaller than the opening 4. FIG. 8A illustrates the different diameters of the opening 4 and the remaining opening within the gate groove 41.

FIG. 8D illustrates portions 71 of the insulator collar 7', which emerge from the oxide growth on semiconductor fin 11. Further portions of the insulator collar 7' shown in FIG.

8D result from oxide growth on the sacrificial fill 6. During the spacer etch of the grown oxide, the recessed oxide mask layer 22' is recessed a second time.

Those sections within the pockets 42 and the gate groove 41 that are filled by the oxide that grows on the semiconductor fin 11 are reliably free of any silicon residues, because no silicon was deposited in these sections in the antecedent course of the process. Residues of the sacrificial material, which may emerge from the recess of the sacrificial material in the upper portion of the pockets 42 or the gate groove 41, are removed during the recess of the underlying protection liner 5'.

As shown in FIGS. 9A-9D, the sacrificial fill 6 and the protection liner 5' are removed by suitable etching processes. According to FIG. 9B, after removal of the protection liner 5', the bottom sections of the pockets 42 are void again. The semiconductor fin 11 is excavated as it was subsequent to the isotropic shallow trench isolation etch process.

Referring to FIGS. 10A-10D, a gate oxide 70 is formed on the exposed portions of the semiconductor fin 11. A first gate conductor material is deposited such that the gate grooves 41 and pockets 42 are filled completely. Then the first gate conductor material is recessed below the upper edge of the insulator collar 7'. A buried gate conductor layer 73 emerges from the recess process.

FIG. 10A shows the buried gate conductor layer 73 which is exposed by the opening 4. According to FIG. 10B, the buried gate conductor layer 73 fills the bottom portion of the pockets 42 and the gate groove 41, and wraps around the edge of the semiconductor fin 11 extending along three sides of the semiconductor fin 11 in a FinFET-like manner. The first gate conductor material is preferably doped polycrystalline silicon. The gate dielectric 70 is preferably formed by thermal oxide growth and insulates the buried gate conductor layer 73 from the semiconductor fin 11.

As shown in FIGS. 11A-11D, the double recessed oxide mask layer 22" is then removed and a second gate conductor material 74, preferably polycrystalline silicon, is deposited and structured to word lines 66 by photolithographic means. The second gate conductor material 74 is electrically connected both to the buried gate conductor layer 73 and to the bottom polysilicon mask layer 23, wherein a gate electrode and portions of a connectivity line (word line) are formed. The connectivity line connects the gate electrode to other semiconductor elements, for example to a word line driver unit of a DRAM.

The semiconductor fin 11 comprises the active area of a FinFET-like extended U-grooved transistor that is controlled by the gate electrode. Source/drain regions 111, 112 of the transistor (see FIG. 24) are provided within the semiconductor fin 11 adjacent to the insulator collar 7'.

FIGS. 12A-14D illustrate a second exemplary embodiment of the invention, which uses a deposited material for the formation of the insulator collar. The second embodiment of the inventive method follows the process according FIGS. 1-7 as explained in detail above. Referring to FIGS. 12A-12D, after the recess of the conformal protection liner 5, a conformal insulator layer 8 is deposited. The material of the insulator layer 8 is preferably silicon oxide. The insulator layer 8 is deposited in a thickness that is sufficient to fill the remaining void upper sections of the pockets 42. The insulating layer 8 covers the recessed oxide mask layer 22', the inner sidewalls of the opening 4 and the exposed surface of the sacrificial fill 6. The insulating layer 8 fills the upper portions of the pockets 42.

Figure 13A:
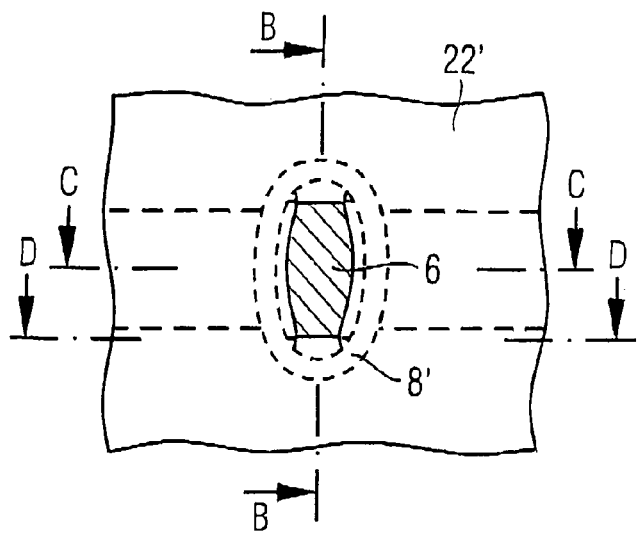
Figure 13B:
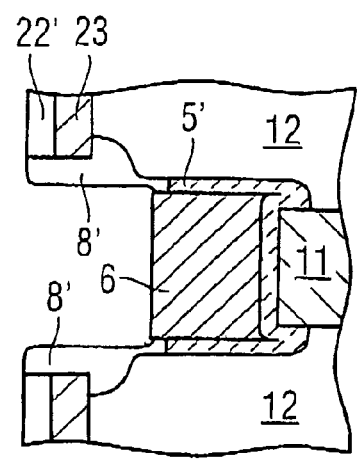
Figure 13C:
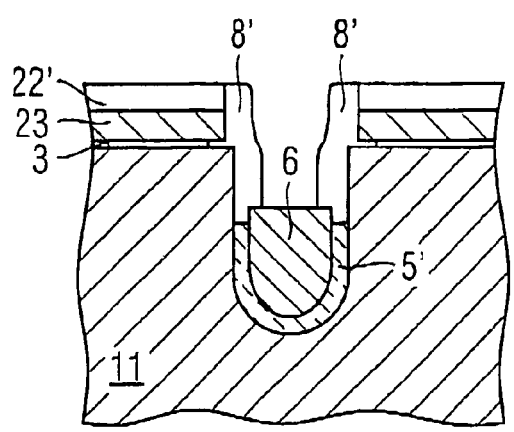
Figure 13D:
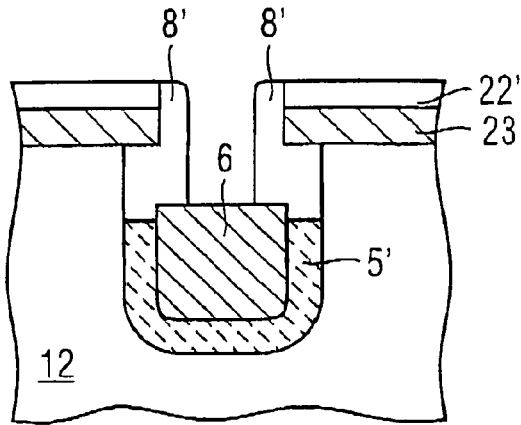
Figure 14A:
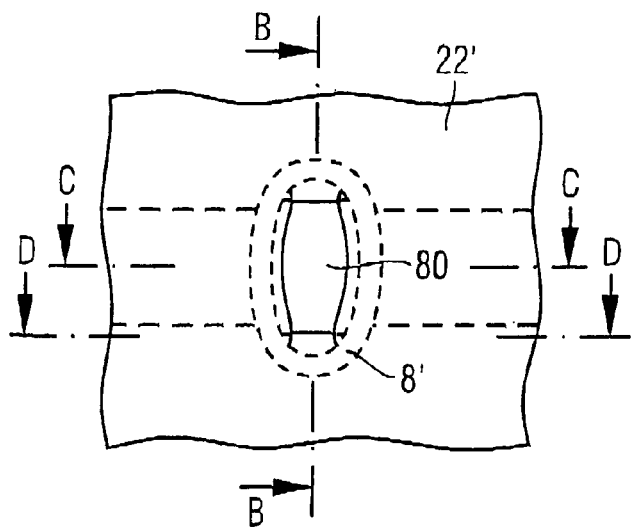
Figure 14B:
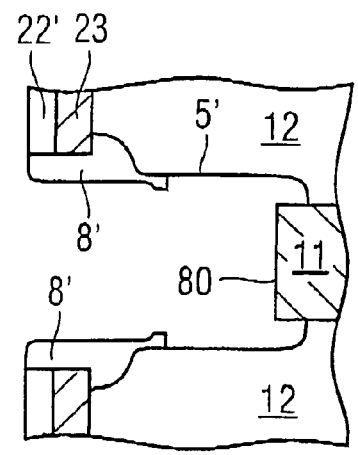
Figure 14C:
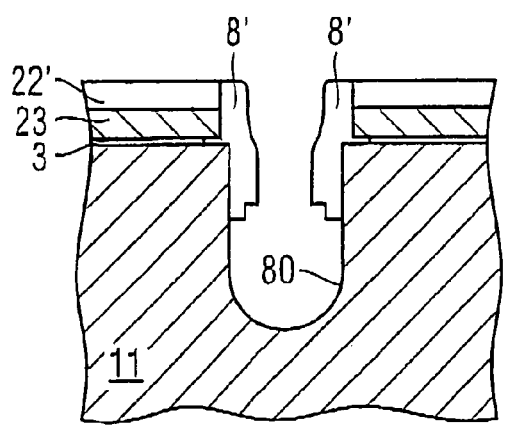
Figure 14D:
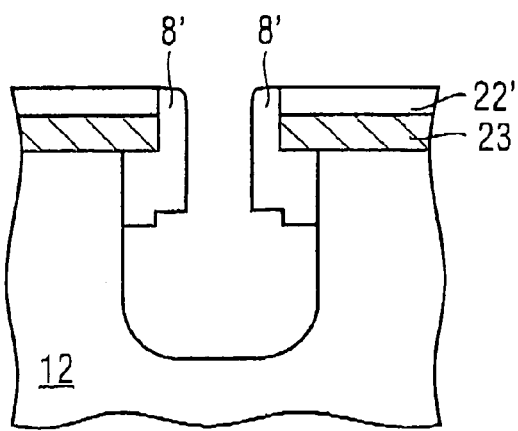
Figure 15A:
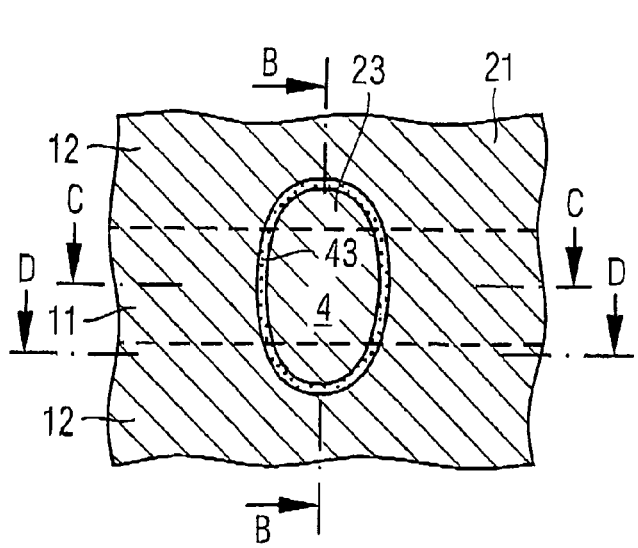
Figure 15B:
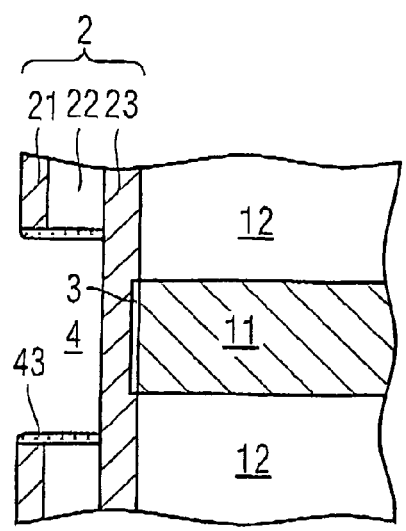
Figure 15C:
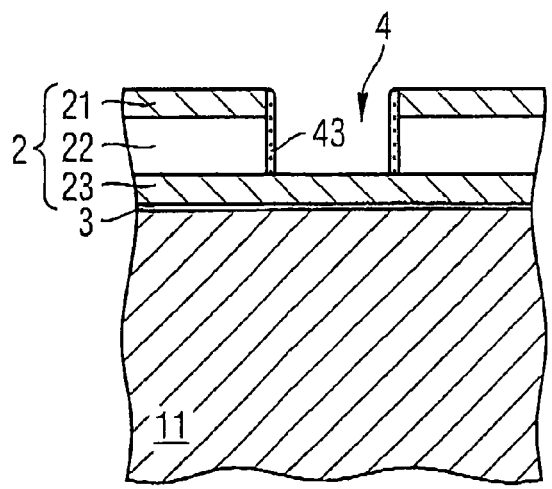
Figure 15D:
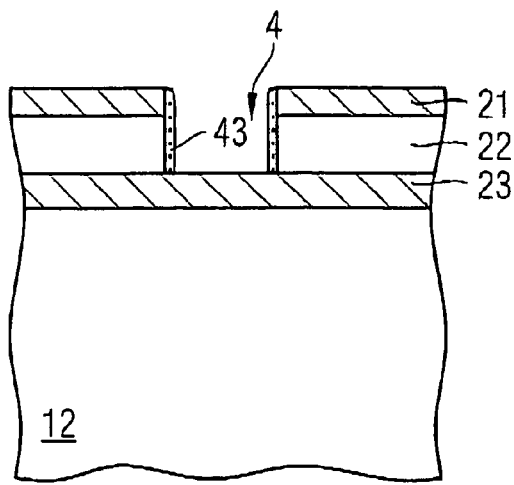
Figure 16A:
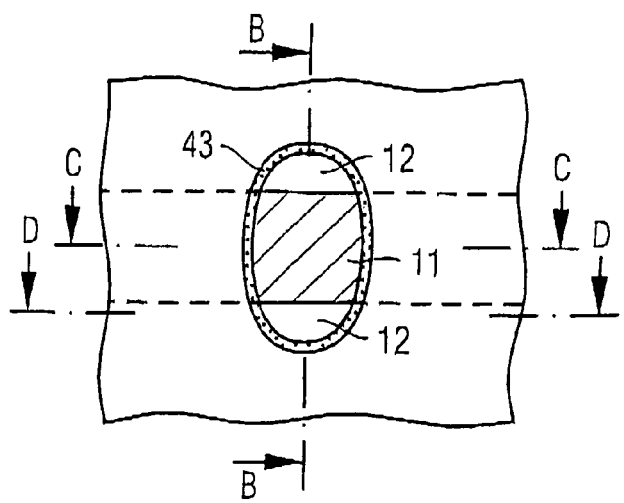
Figure 16B:
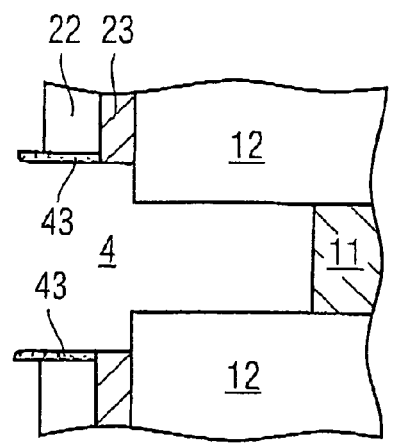
Figure 16C:
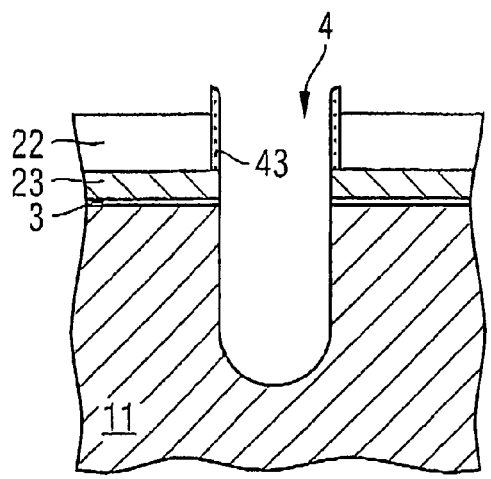
Figure 16D:
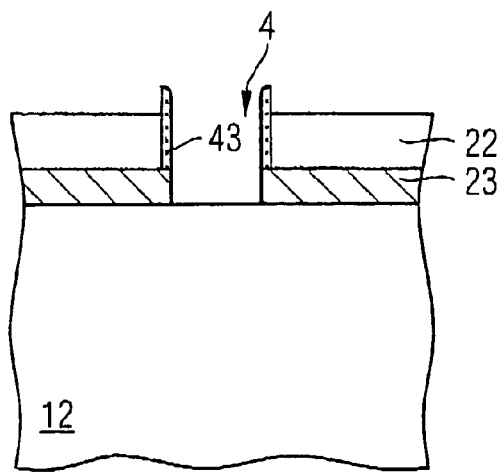
Figure 18A:
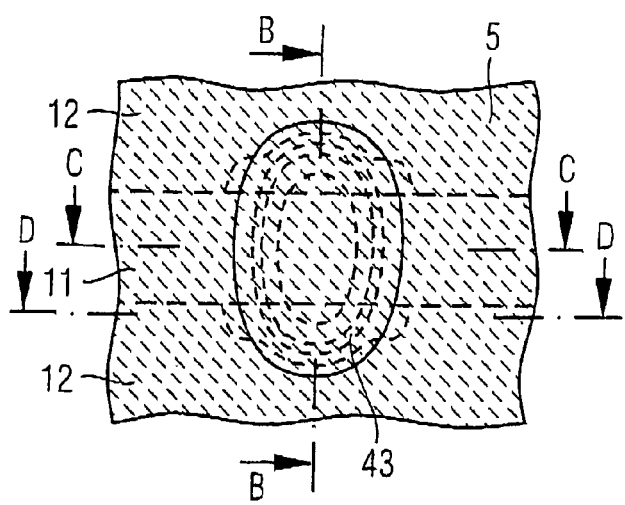
Figure 18B:
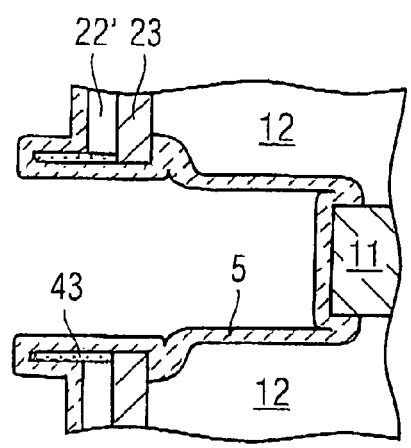
Figure 18C:
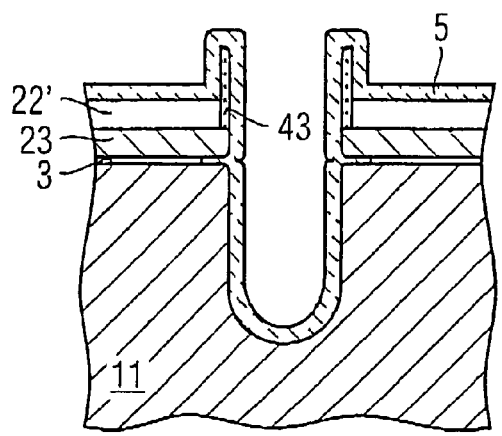
Figure 18D:
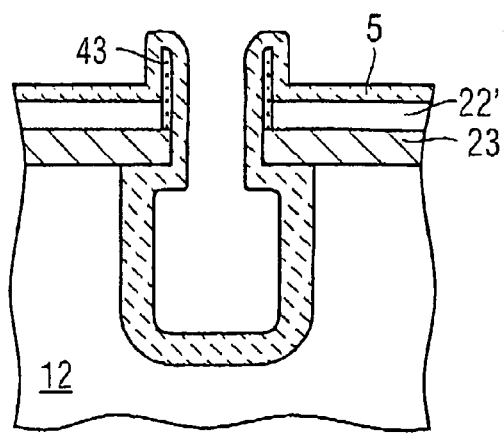
Figure 19A:
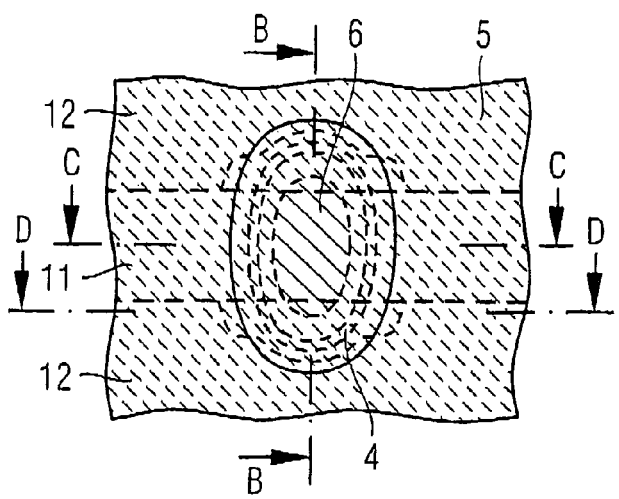
Figure 19B:
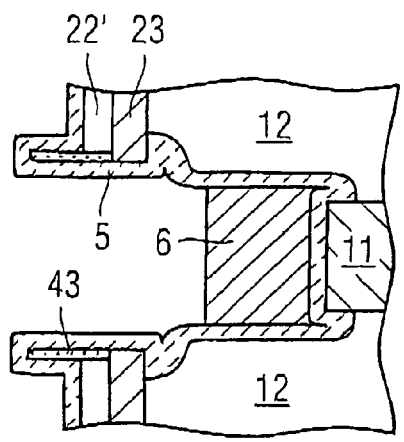
Figure 19C:
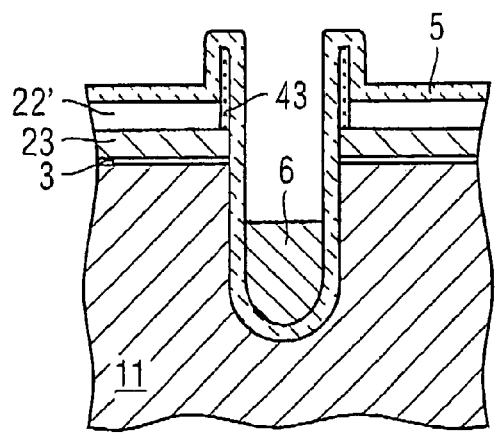
Figure 19D:
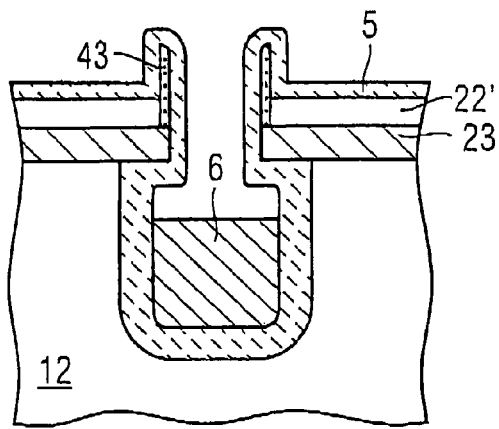
Figure 20A:
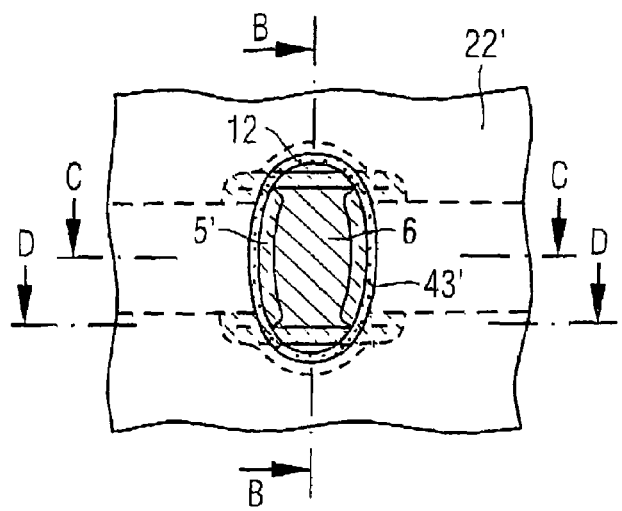
Figure 20B:
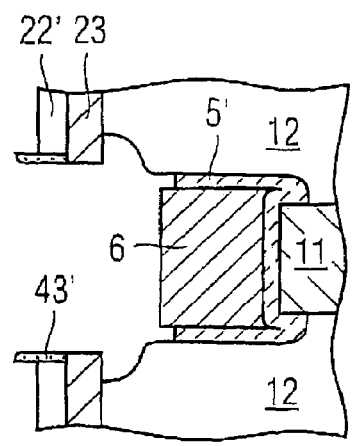
Figure 20C:
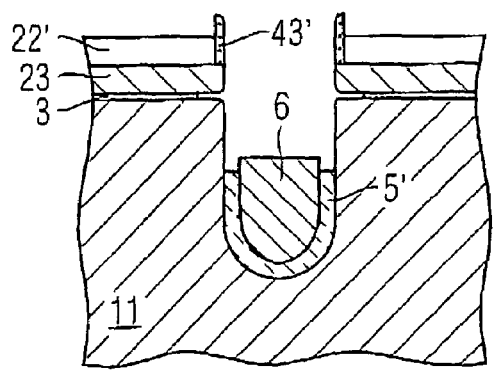
Figure 20D:
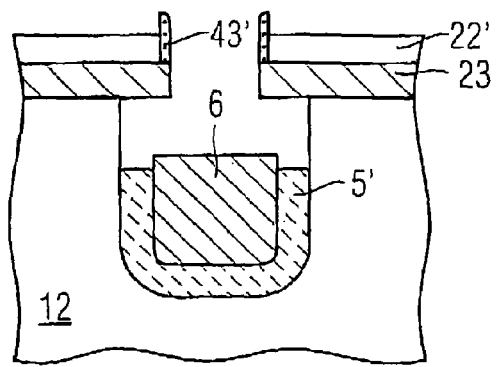
Figure 21A:
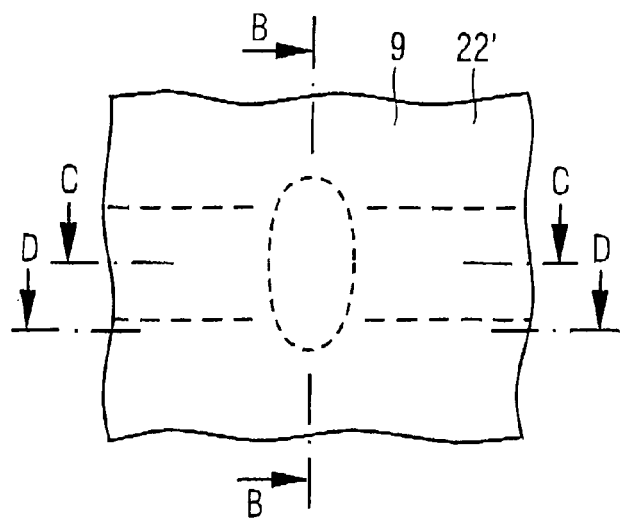
Figure 21B:
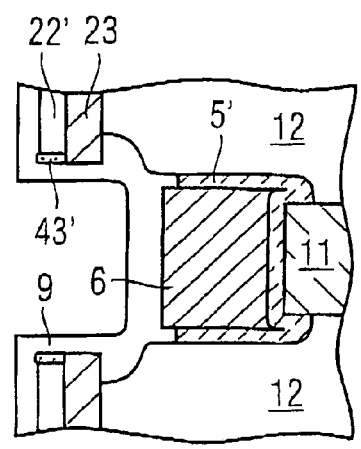
Figure 21C:
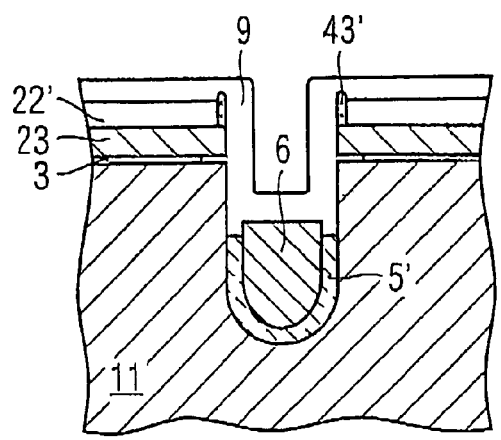
Figure 21D:
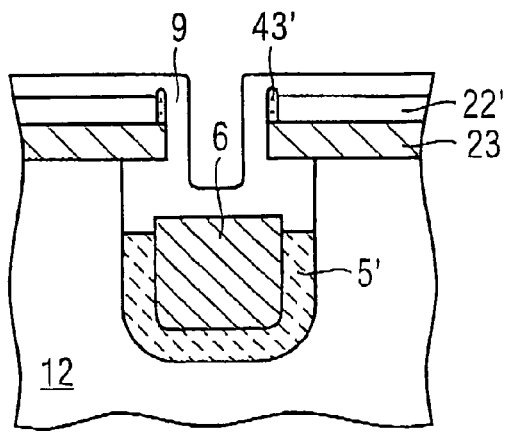
Figure 22A:
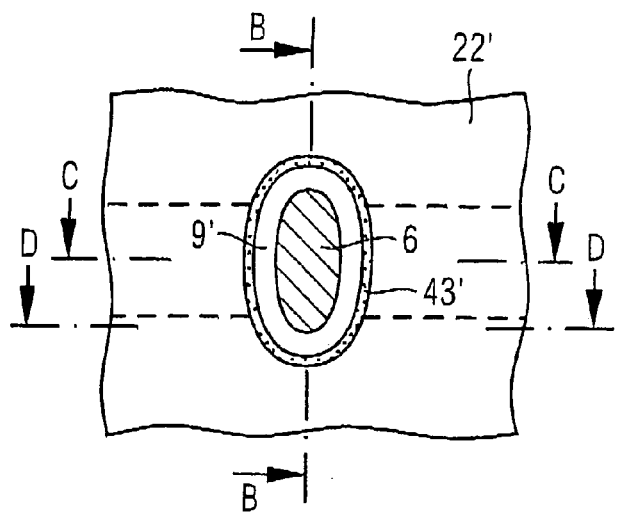
Figure 22B:
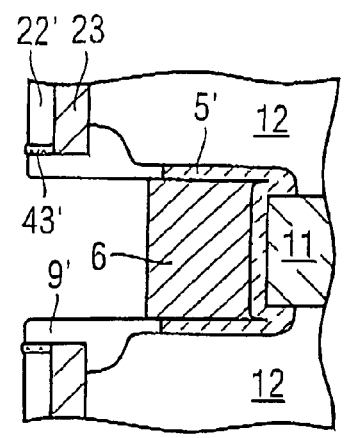
Figure 22C:
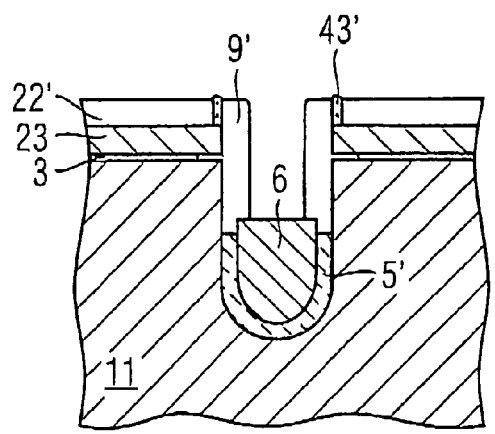
Figure 22D:
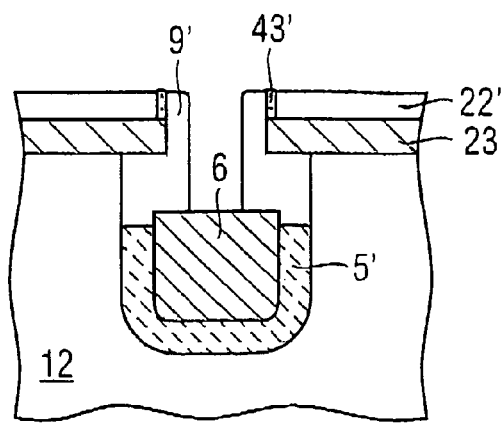
Figure 23A:
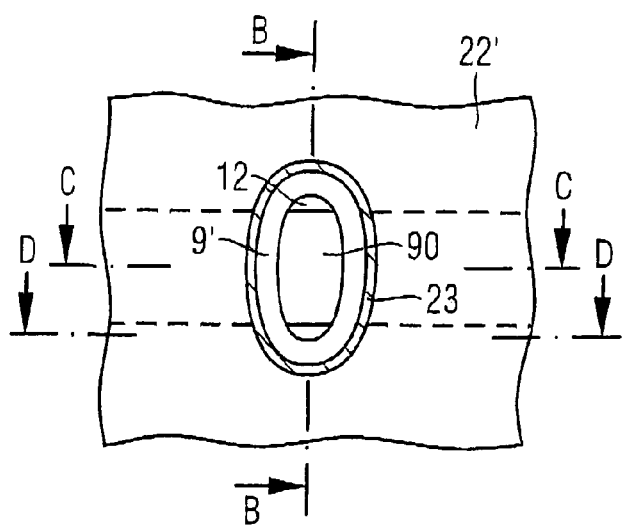
Figure 23B:
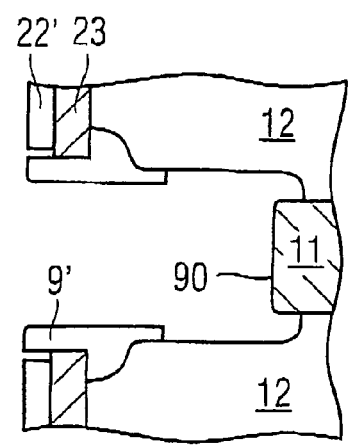
Figure 23C:
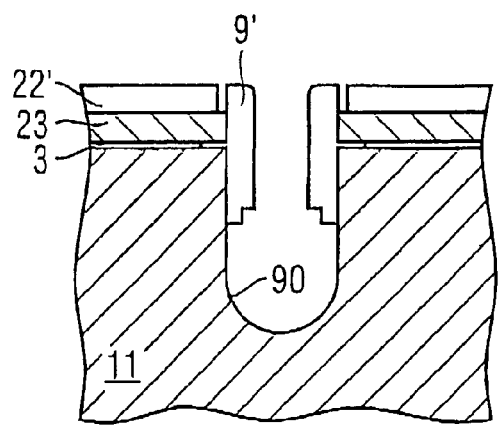
Figure 23D:
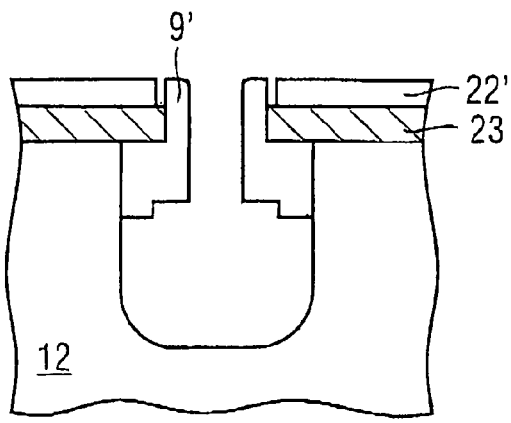

FIGS. 13B-13D show the insulator collar 8' emerging from a subsequent spacer etch process in the respective cross-sectional views. According to FIG. 13A, the insulator collar 8' lines the opening 14 and the upper portion of the gate groove 41 and surrounds an exposed portion of the sacrificial fill 6.

The further processing corresponds to that of FIGS. 9A to 11D, wherein the resulting structures differ slightly in the geometric formation of the respective insulator collars 7', 8'. The geometric formation of the insulator collar 7' according to FIGS. 14A-14D essentially corresponds to that of the insulator collar 8 according to FIG. 9.

FIGS. 15-23 illustrate a third exemplary embodiment of the invention. The third embodiment differs from the first embodiment in the formation of the nitride spacer. While the nitride spacer 40 according to the first embodiment lines the opening 4 in the complete mask stack 2, the nitride spacer 43 according to the third embodiment lines only the upper portion of the opening 4, wherein the upper portion of the opening 4 corresponds to the top polysilicon layer 21 and the oxide mask layer 22.

According to FIGS. 15A-15D, the nitride spacer 43 is formed before the etch of the bottom polysilicon mask layer 23, such that the nitride spacer 43 lines the upper portion of the opening 4, i.e., the edges of the top polysilicon layer 21 and the oxide mask layer 22 only. The following process steps according to the third embodiment are the same as that of the first embodiment.

Referring to FIG. 16A-16D, the edge of the etched bottom polysilicon layer 21 is exposed by the opening 4 after the formation of the gate groove 41. According to FIGS. 17A-17D, the bottom polysilicon mask layer 23 is not affected by the isotropic shallow trench isolation etch. The processing according to FIGS. 18A-22D corresponds to the processing according to FIGS. 5A-7D and 12A-13D, wherein during the recess of the conformal protection liner 5, at least a lower portion of the nitride spacer 43 is left to protect the underlying section of the bottom polysilicon layer 23 during the removal of the sacrificial fill 6 in further course of processing. According to FIGS. 23A-23D, the recessed nitride spacer 43' is removed together with the protection liner 5' after the removal of the sacrificial fill 6.

Figure 24:
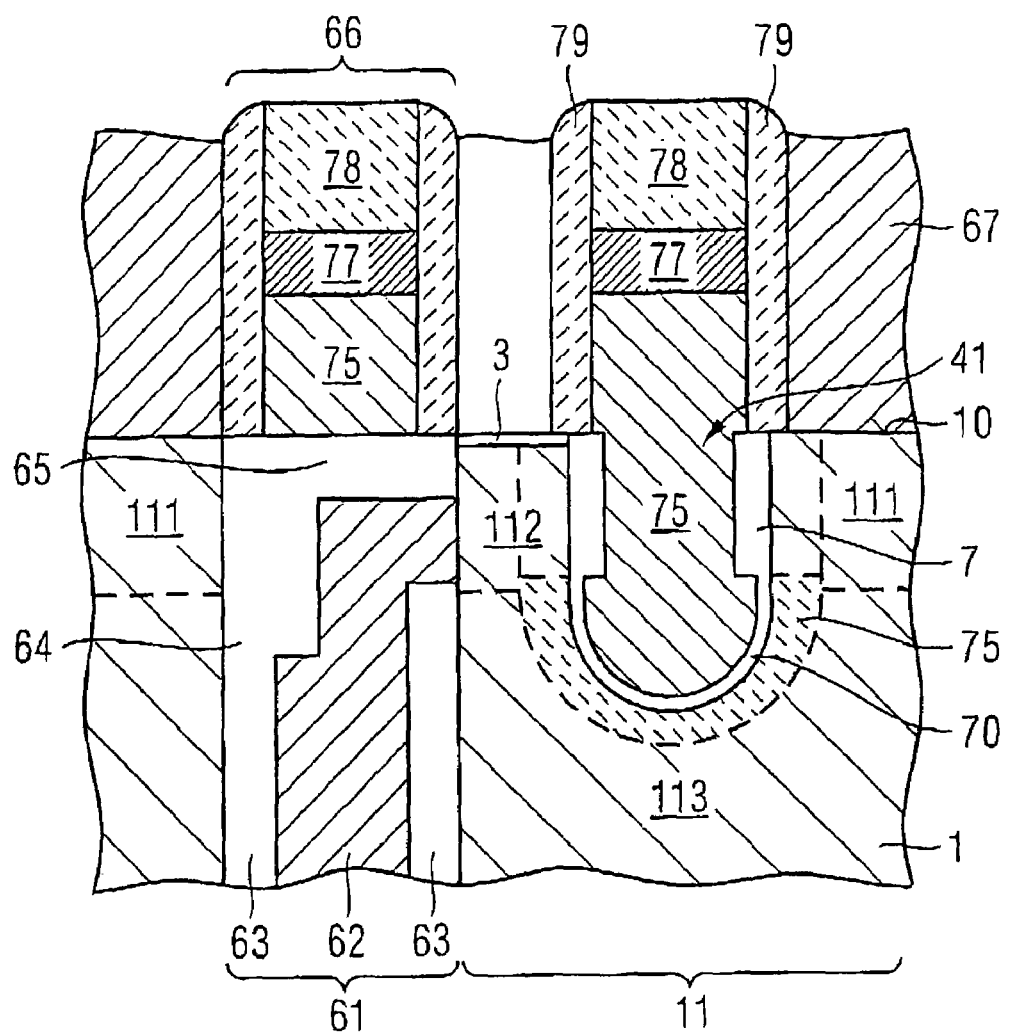
FIG. 24 is a simplified cross sectional view of a memory cell comprising a trench capacitor and a recess channel array transistor with corner gate device fabricated in accordance with an embodiment of the present invention.

FIG. 24 shows a cross-sectional view of a section of a memory cell comprising a trench capacitor 61 and an access device. The access device is a RCAT with corner gate device, wherein the RCAT is fabricated according to the inventive method. The cut line runs along the center of semiconductor fin 11.

An active area of the RCAT is formed within a semiconductor fin 11 that is part of a semiconductor substrate 1. The active area comprises a first source/drain region 111, a second source/drain region 112 and a channel region 113. The first and the second source/drain regions 111, 112 adjoin a pattern surface 10 of the substrate 1.

A trench capacitor 61 is buried in the substrate 1. In the illustrated section of the memory cell, a storage electrode 62 of the trench capacitor 61 is insulated from the substrate 1 by a collar 63. A shallow isolation structure 64 insulates the storage electrode 62 from a further RCAT adjoining on the left side. A top isolation structure 65 separates the storage electrode 62 from a connectivity line (word line) 66. The trench capacitor 61 comprises further a common electrode, which is formed as a doped region within the substrate 1 and a capacitor dielectric, which separates the storage electrode 62 and the common electrode. The common electrode and the capacitor dielectric are formed outside the illustrated section of the memory cell.

The second source/drain region 112 of the RCAT adjoins the storage electrode 62 of the trench capacitor 61. The first source/drain region 111 of the RCAT adjoins a bit contact structure 67, which connects the memory cell to a data line (not shown).

A gate conductor 75 is provided within a gate groove 41 between the source/drain regions 111, 112. In a lower portion of the gate groove 41 a gate dielectric 70 separates the gate electrode 75 from the channel region 113, which connects the source/drain regions 111, 112. In an upper portion of the gate groove 41 an insulator collar 7' insulates the gate electrode 75 from the source/drain regions 111, 112, which are formed within the semiconductor fin 11.

In parallel vertical planes behind and in front of the cut plane, shallow trench isolations adjoin the semiconductor fin 11. The lower edge of the shallow trench isolations is below the lower edge of the gate groove 41.

Pockets are formed between the shallow trench isolations and the semiconductor fin 11. The pockets are filled in sections by the insulator collar 7' in the upper portion and by the gate dielectric 70 and the gate conductor 75 in the lower portion. The dotted line illustrates the shape of the pockets in the parallel planes. Those sections of the gate conductor 75 that fill the pockets form corner gate sections 751 of the gate conductor 75.

The gate conductor 75 is covered by a high-conductivity layer 77. A cap layer 78 covers the high conductivity layer 77. Gate spacers 79 are formed on vertical sidewalls of the gate stack. The gate conductor 75, the high conductivity layer 77 and the cap layer 78 are patterned to form word lines 66, wherein sections of each word line 66 form gate electrodes of the access devices of a plurality of memory cells.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of manufacturing an integrated circuit including a field effect transistor device, the method comprising;
   (a) forming a gate groove in a semiconductor fin, the gate groove extending between opposing long sides of the semiconductor fin;
   (b) recessing isotropically shallow trench isolations provided at the both long sides of the semiconductor fin to form pockets between the semiconductor fin and the shallow trench isolations, the pockets extending along the long sides of the semiconductor fin;
   (c) forming a protection liner covering the semiconductor fin and the shallow trench isolations in a bottom portion of the gate groove and the pockets and leaving upper portions of the semiconductor fin exposed;
   (d) providing an insulator collar on the exposed upper portions of the semiconductor fin and
   (e) filling the gate groove and the pockets with a buried gate conductor layer.

2. The method of claim 1, wherein (c) includes:
   depositing a conformal protection liner;
   depositing a sacrificial material;
   recessing the sacrificial material, such that a residual portion of the sacrificial material forms a sacrificial fill covering the conformal protection liner in the bottom portions of the gate groove and the pockets, wherein the protection liner is exposed in upper portions of the gate groove and the pockets; and
   removing exposed sections of the conformal protection liner, wherein a residual portion of the conformal protection liner forms the protection liner.

3. The method of claim 2, wherein the conformal protection liner is deposited such that the pockets between the semiconductor fin and the shallow trench isolations are filled completely.

4. The method of claim 1, wherein (a) includes:
   depositing a mask stack on the semiconductor substrate, the mask stack covering the shallow trench isolations and the semiconductor fin;
   providing an opening in the mask stack, the opening being placed symmetrically above the semiconductor fin between opposing short sides of the semiconductor fin and extending at least between the long sides of the semiconductor fin; and
   etching the semiconductor fin selectively to the shallow trench isolations.

5. The method of claim 4, wherein depositing the mask stack includes:
   depositing a bottom polysilicon mask layer;
   depositing an oxide mask layer; and
   depositing a top polysilicon mask layer.

6. the method of claim 5, wherein providing the opening includes:
   patterning a resist layer via photolithography, the resist layer including a resist opening;
   transferring the resist opening into the top polysilicon mask layer and the oxide mask layer;
   forming a nitride spacer on the inner sidewall of the opening in the top polysilicon mask layer and the oxide mask layer; and
   transferring the opening into the bottom polysilicon mask layer.

7. The method of claim 5, wherein providing the opening includes:
   patterning a resist layer via photolithography, the resist layer including a resist opening;
   patterning the mask stack according to the pattern of the resist layer, wherein the resist opening is transferred into the mask stack; and
   forming a nitride spacer on the inner sidewall of the opening of the mask stack.

8. The method of claim 1, wherein (d) comprises a thermal oxidation of silicon to form the insulator collar.

9. The method of claim 1, wherein (d) includes depositing a dielectric material at a bottom portion of the gate groove.

10. The method of claim 1, wherein a first and a second source/drain region are provided within the semiconductor fin, the first source/drain region being formed within a first section of the semiconductor fin adjoining a first short side, the second source/drain region being formed within a second section of the semiconductor fin adjoining a second short side opposing the first short side, wherein the first and second source/drain regions are formed in upper portions of the semiconductor fin adjacent to the insulator collar.

11. The method of claim 1, further comprising removing the protection liner, after (d) and before (e).

12. The method of claim 11, further comprising providing a gate dielectric covering the semiconductor fin in the bottom portion of the gate groove and the pockets after removing the protection liner.

13. The method of claim 1, wherein the recess starts from interface planes of the gate groove and the shallow trench isolations.

* * * * *